United States Patent
Ricks et al.

(10) Patent No.: US 7,251,882 B2
(45) Date of Patent: Aug. 7, 2007

(54) METHOD FOR ASSEMBLING MICRO-COMPONENTS TO BINDING SITES

(75) Inventors: Theodore K. Ricks, Rochester, NY (US); Ravi Sharma, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 207 days.

(21) Appl. No.: 10/849,329

(22) Filed: Sep. 3, 2004

(65) Prior Publication Data

US 2006/0048384 A1 Mar. 9, 2006

(51) Int. Cl.
*H05K 3/30* (2006.01)

(52) U.S. Cl. .......................... 29/832; 29/825; 29/840; 204/450

(58) Field of Classification Search ............... 29/825, 29/832, 840; 204/450
See application file for complete search history.

(56) References Cited

U.S. PATENT DOCUMENTS

| | | | |
|---|---|---|---|
| 5,545,291 A | 8/1996 | Smith et al. |
| 5,783,856 A | 7/1998 | Smith et al. |
| 5,824,186 A | 10/1998 | Smith et al. |
| 5,904,545 A | 5/1999 | Smith et al. |
| 5,955,515 A | 9/1999 | Kimura et al. |
| 6,274,508 B1 | 8/2001 | Jacobsen et al. |
| 6,417,025 B1 | 7/2002 | Gengel |
| 6,420,266 B1 | 7/2002 | Smith et al. |
| 6,460,966 B1 | 10/2002 | Hellekson et al. |
| 6,468,638 B2 | 10/2002 | Jacobsen et al. |
| 6,479,395 B1 | 11/2002 | Smith et al. |
| 6,527,964 B1 | 3/2003 | Smith et al. |
| 6,536,106 B1 | 3/2003 | Jackson et al. |
| 6,555,408 B1 | 4/2003 | Jacobsen et al. |

(Continued)

FOREIGN PATENT DOCUMENTS

EP 1 085 568 A 3/2001

(Continued)

OTHER PUBLICATIONS

C.R. Barry et al., "Approaching Programmable Self-Assembly from Nanoparticle-Based Devices to Integrated Circuits", Proceedings of the Foundations of Nanoscience, Utah, Apr. 21-23, 2004, XP002367627.

(Continued)

*Primary Examiner*—Carl J. Arbes
(74) *Attorney, Agent, or Firm*—Ronald R. Schindler, II

(57) ABSTRACT

A support and a method for assembling micro-components to binding sites on the support are provided. The support has a pattern of electrical conductors adapted to conduct electrical energy between binding sites. In accordance with the method, an electrical signal is passed through at least one conductive path including at least one of the conductors so that heat is generated by a portion of each conductive path proximate to the binding sites, a first fluid is applied to the support that is adapted to increase in viscosity when heated, and, a carrier fluid having first micro-components adapted to engage the binding sites is applied to the support. Wherein the heat from the at least one conductive path increases the viscosity of the first fluid in areas proximate to the selected binding sites so as to inhibit first micro-components from engaging the binding sites.

9 Claims, 23 Drawing Sheets

U.S. PATENT DOCUMENTS

| | | | |
|---|---|---|---|
| 6,569,382 B1 * | 5/2003 | Edman et al. | 422/68.1 |
| 6,586,338 B2 | 7/2003 | Smith et al. | |
| 6,605,453 B2 | 8/2003 | Ozkan et al. | |
| 6,611,237 B2 | 8/2003 | Smith | |
| 6,623,579 B1 | 9/2003 | Smith et al. | |
| 7,060,224 B2 * | 6/2006 | Edman et al. | 422/68.1 |
| 2002/0005294 A1 | 1/2002 | Mayer et al. | |
| 2002/0031813 A1 | 3/2002 | Ozkan et al. | |
| 2002/0093396 A1 | 7/2002 | Smith | |
| 2002/0149107 A1 | 10/2002 | Chang et al. | |
| 2002/0153606 A1 | 10/2002 | Gengel | |
| 2003/0068519 A1 | 4/2003 | Brewer et al. | |
| 2003/0140317 A1 | 7/2003 | Brewer et al. | |
| 2003/0155151 A1 | 8/2003 | Hermanns et al. | |
| 2003/0182794 A1 | 10/2003 | Fonstad, Jr. et al. | |
| 2003/0183904 A1 | 10/2003 | Fonstad, Jr. et al. | |
| 2003/0186469 A1 | 10/2003 | Fonstad, Jr. et al. | |
| 2004/0068864 A1 | 4/2004 | Hadley et al. | |
| 2004/0198074 A1 * | 10/2004 | Swier et al. | 439/65 |
| 2004/0218009 A1 * | 11/2004 | Akhavain et al. | 347/50 |

FOREIGN PATENT DOCUMENTS

EP  1 120 155 A  8/2001

OTHER PUBLICATIONS

Professor John S. Smith, "High Density, Low Parasitic Direct Integration by Fluidic Self Assembly (FSA)", IEEE-Dec. 10, 2000, pp. 201-204, XP000988832.

Uthara Srinivasan et al., "Microstructure to Substrate Self-Assembly Using Capillary Forces", Journal of Microelectromechanical Systems, Mar. 2001, vol. 10, No. 1, pp. 17-24, XP001123703.

* cited by examiner

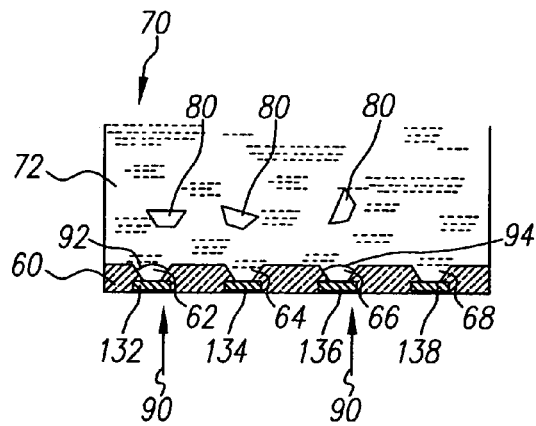
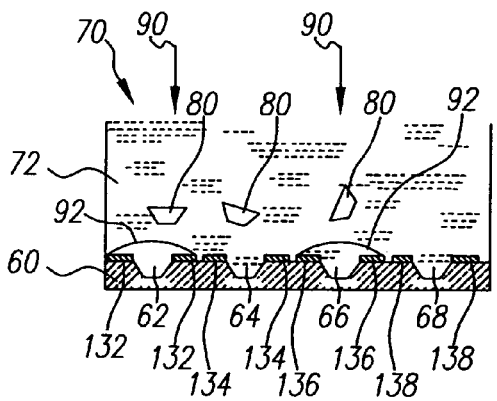
FIG. 5A  FIG. 5B
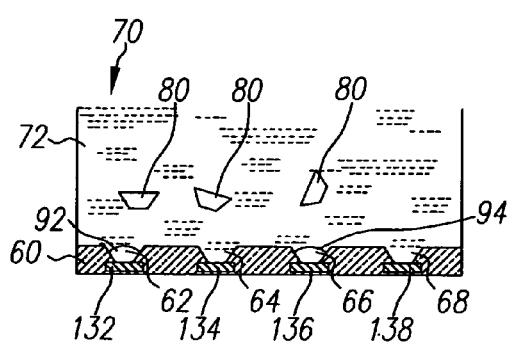
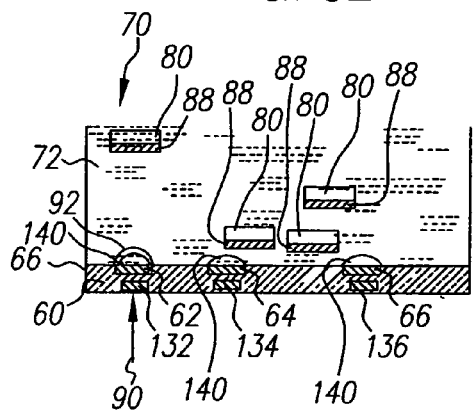
FIG. 5C  FIG. 5D
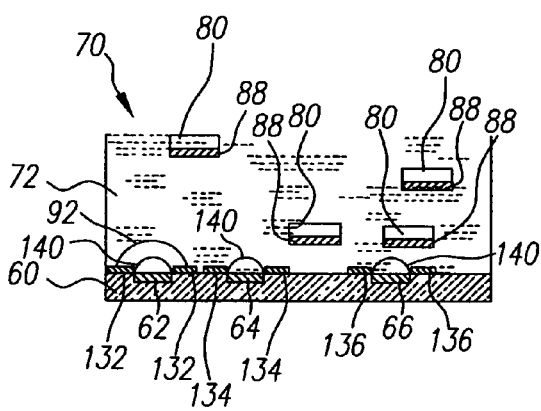
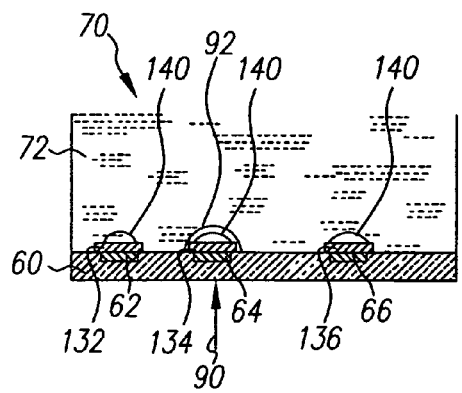
FIG. 5E  FIG. 5F

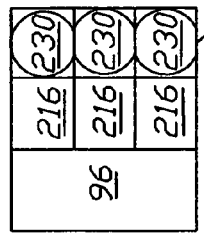
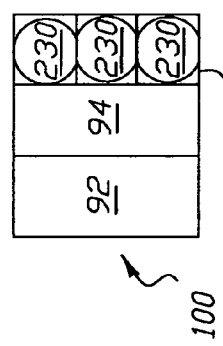
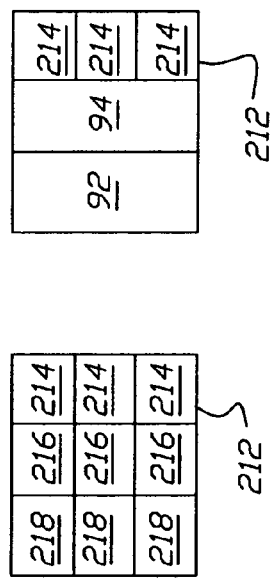
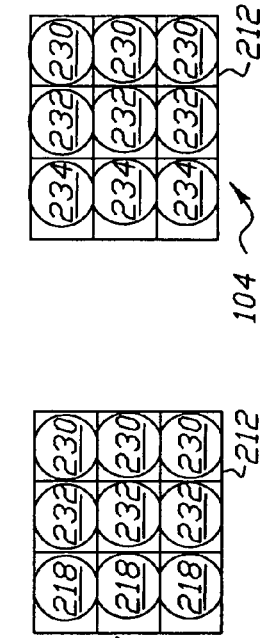
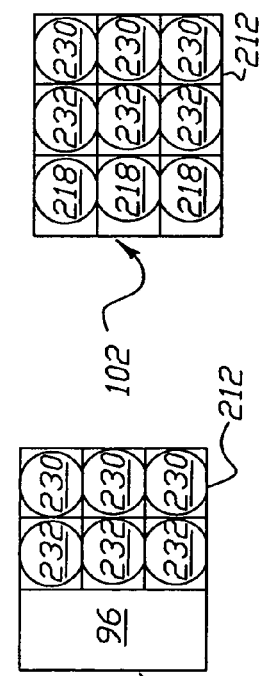
FIG. 11B  FIG. 11C  FIG. 11D  FIG. 11E  FIG. 11F  FIG. 11G  FIG. 11H

METHOD FOR ASSEMBLING MICRO-COMPONENTS TO BINDING SITES

CROSS-REFERENCE TO RELATED APPLICATIONS

This application is related to U.S. Ser. No. 10/849,302 entitled THERMALLY CONTROLLED FLUIDIC SELF-ASSEMBLY METHOD AND SUPPORT, in the names of Daniel D. Haas et al.; and U.S. Ser. No. 10/849,327 entitled THERMALLY CONTROLLED FLUIDIC SELF-ASSEMBLY METHOD, in the names of Ravi Sharma et al., all filed May 19, 2004.

FIELD OF THE INVENTION

The present invention relates to methods for fluidic micro-assembled structure and, in particular, to methods and apparatuses for selective fluidic assembly of micro-components can be performed.

BACKGROUND OF THE INVENTION

Micro-assembled devices offer the promise of an entirely new generation of consumer, professional, medical, military, and other products having features, capabilities and cost structures that cannot be provided by products that are formed using conventional macro-assembly and macro-fabrication methods. For example, there is a need, particularly in the field of flat panel displays, smart cards and elsewhere, for microelectronic devices or chips that can be integrated into or assembled as either a system or as an array, in a relatively inexpensive manner. In another example, there is a need for a cost effective method for allowing accurate and cost effective assembly of colored display elements such as electrophoretic beads in specific locations on display panels.

One advantage of such micro-assembled devices is that they can utilize different materials and devices (a process generally termed heterogeneous integration) in ways that create new product possibilities. For example, such heterogeneous integration provides the opportunity for relatively rigid structures such as such as silicon transistors or other electronic devices to be assembled into more complex electronic circuits using a flexible substrate as opposed to the rigid silicon substrates currently used for this purpose. In this example, such heterogeneous integration would provide a less expensive means to assemble silicon based integrated circuit components and/or any other kind of circuit components to form integrated circuits on flexible or rigid supports that are not made from silicon. However, it will be appreciated that in providing such heterogeneous integrated circuits, it is necessary that these processes provide for precise placement of multiple types of independent structures on the substrate. Such heterogeneous integration can also be used for other purposes. For example, heterogeneous integration can be used for purposes such as the assembly of pharmaceutical products, advanced materials, optical structures, switching structures, and biological structures.

Of particular interest in the electronic industry is the potential for micro-assembly to solve existing problems in the assembly of highly desirable but complex structures such as electronic displays. Typical electronic displays use a structure known as a "front plane" as the image forming surface. The "front plane" comprises an arrangement of image forming elements also known as active elements formed from structures such as liquid crystals, electroluminescent materials, organic light emitting diodes (OLEDs), up converting phosphors, down converting phosphors, light emitting diodes, electrophoretic beads, or other materials that can be used to form images. Such active elements typically form images when an electric field or some other stimulus or other field is applied thereto. Such electronic displays also incorporate a structure known as a "back plane" that comprises structures such as electrodes, capacitors, transistors, conductors, and pixel drivers and other circuits and integrating components that are intended to provide appropriate stimulus to the active components to cause the active components to present an image. For example, the active components can react to stimulus by emitting controlled amounts of light or by changing their reflectivity or transmissivity to form an image on the front plane.

It is well known to use heterogeneous integration methods to place elements on a substrate. Such heterogeneous integration methods can be generally divided into one of two types: deterministic methods and random methods. Deterministic methods use a human or robotic structure to place individual elements into particular locations on the substrate. Such methods are also known as "pick and place" methods. Such "pick and place" methods offer two advantages: complete control and positive indication that components have been appropriately placed in a desired location. Further, such "pick and place" methods also allow the precise assembly of different types of micro-components to form a micro-assembled structure that integrates different types of materials, micro-assembled structures and components.

It will be appreciated that deterministic methods require a high degree of precision by the person or machine executing the deterministic assembly process. Accordingly, such deterministic methods are difficult to apply in a cost effective manner. This is particularly true where the assembly of micro-components is to occur at a high rate of assembly or where large-scale assembly of micro-components is to be performed such as is required in commercial, pharmaceutical, or other applications.

Random placement methods such as fluidic self-assembly have been used to integrate electronic devices such as GaAs LEDs onto silicon substrates. Fluidic self-assembly is a fabrication process whereby a large number of individual shaped micro-assembled structures are integrated into correspondingly shaped recesses on a substrate using a liquid medium for transport. This method of self-assembly relies on gravitational and shear forces to drive the self-assembly of micro-components. Examples of this include U.S. Pat. No. 5,545,291 filed by Smith et al. on Dec. 17, 1993 entitled Method for Fabricating Self-Assembling Micro-Assembled Structures; U.S. Pat. No. 5,783,856 filed by Smith et al. on May 9, 1995 entitled Method for Fabricating Self-Assembling Micro-Assembled Structures; U.S. Pat. No. 5,824,186 filed by Smith et al. on Jun. 7, 1995 entitled Method and Apparatus for Fabricating Self-Assembling Micro-Assembled Structures; and, U.S. Pat. No. 5,904,545 filed by Smith et al. on Jun. 7, 1995 and entitled Apparatus for Fabricating Self-Assembling Micro-Assembled Structures.

FIG. 1a illustrates, generally, the operation of one type of prior art random placement method. In FIG. 1a, a substrate 10 is shown having binding sites in the form of recesses 21 that are shaped to accept correspondingly shaped micro-components 47 suspended in a fluid 29. As is shown in FIG. 1a, fluid 29 contains micro-components 47 and is applied to substrate 10. When this occurs, gravity and/or other forces draw micro-components 47 onto substrate 10 and into recesses 21. This allows for the assembly of micro-components 47 to substrate 10 using a massively parallel process that is more suitable for high volume and/or large scale assembly processes.

Other approaches have been developed for using fluidic self-assembly to build a micro-assembled structure without relying exclusively on gravitational and/or shear forces. Some of these are illustrated in FIGS. 1b-1e. In each of FIGS. 1b-1e, a substrate 10 is shown having binding sites 21-25. Binding sites 22-25 can take many forms, only some of which are shown in FIGS. 1b-1e.

In FIG. 1b, a fluidic self-assembly method is shown wherein a substrate 10 is provided having binding sites 22 that are adapted with hydrophobic patches that engage with hydrophobic surfaces 48 on micro-components 49 suspended in fluid 29 and thereby locate the micro-components 49 on substrate 10. One example of this type is shown and described in U.S. Pat. No. 6,527,964 filed by Smith et al. on Nov. 2, 1999 entitled "Method and Apparatuses for Improved Flow in Performing Fluidic Self-Assembly." The '964 patent describes a substrate that is exposed to a surface treatment fluid to create a surface on the substrate that has a selected one of a hydrophilic or a hydrophobic nature. A slurry is dispensed over the substrate. The slurry includes a fluid and a plurality of the micro-components. Two types of micro-components are provided: one that is designed to adhere to a hydrophilic surface associated with a co-designed receptor site and one that is designed adhere to a hydrophobic surface associated with a co-designed receptor site. As the slurry is dispensed over the substrate 10, the selectively hydrophilic surfaces of selected ones of the micro-components adhere to hydrophilic surfaces on substrate 10, while not adhering to hydrophobic surfaces. Micro-components that have a hydrophilic surface engage hydrophilic patches on the substrate. Thus, micro-components are selectively placed in predefined locations on the substrate.

FIG. 1c shows another fluidic self-assembly method. The method illustrated in FIG. 1c uses capillary forces for self-assembly. As is shown in FIG. 1c, binding sites 23 are adapted with drops 32 of a liquid 34. Capillary attraction between liquid 34 and surface 36 on micro-components 51 causes micro-components 51 suspended in fluid 29 to assemble on binding sites 23. However, it will be appreciated that this method requires the precise placement of drops of liquid 34 on substrate 10 and does not necessarily provide the discrimination useful in the assembly of components having multiple types of micro-components. Various versions of this method are described generally in Tien et al. (J. Tien, T. L. Breen, and G. M. Whitesides, "*Crystallization of Millimeter-Scale Objects with Use of Capillary Forces,*" *J. Amer. Chem. Soc.*, vol. 120, pp. 12 670-12 671, 1998.) and Srinivasan et al. (U. Srinivasan, D. Liepamann, and R. T. Howe, *J. Microelectromechanical systems* Vol. 10, 2001, pp. 17-24).

In the prior art illustrated in FIG. 1d, a fluidic self-assembly method is shown wherein binding sites 24 include magnetic patches that attract a magnetic surface 53 on micro-component 52 suspended in fluid 29. Such an approach is described in Mukarami et al. (Y. Murakami, K. Idegami, H. Nagai, A. Yamamura, K. Yokoyama, and E. Tamiya, "*Random fluidic self-assembly of micro-fabricated metal particles,*" in *Proc.* 1999 *Int. Conf Solid-State Sensors and Actuators*, Sendai, Japan, Jun. 7-10, 1999, pp. 1108-1111.) which describes in greater detail the use of magnetic forces to assemble microscopic metal disks onto a substrate patterned with arrays of nickel dots. However, high cost is encountered in providing the arrays of disks on the substrate. Further such methods are typically limited to applications wherein the micro-assembled structures being assembled each have magnetic characteristics that permit the use of magnetic forces in this fashion.

Electrostatic attraction has been proposed for use in positioning micro-components during micro-assembly. U.S. Patent Publication No. 2002/0005294 filed by Mayer, Jackson and Nordquist, entitled "Dielectrophoresis and Electrohydrodynamics Mediated Fluidic Assembly of Silicon Resistors"; and S. W. Lee, et al., Langmuir "Electric-Field-Mediated Assembly of Silicon Islands Coated With Charged Molecules", Volume 18, Pg. 3383-3386, (2002) describe such methods. FIG. 1e illustrates a general example of this electrostatic approach. As is shown in FIG. 1e, substrate 10 has binding sites 25 that are adapted with electrodes 27 that attract oppositely charged micro-components 55 suspended in fluid 29. However, the use of electrostatically based fluidic micro-assembly can involve high cost associated with providing addressable electrode structures required for long range transport of micro-components by dielectrophoresis.

As noted above, many micro-assembled structures incorporate a variety of different types of micro-components. Thus, heterogeneous integration of more than one type of micro-component using such a massively parallel random placement process, such as fluidic micro-assembly, is highly desirable. What is needed therefore is a method for assembling micro-components into a micro-assembled structure on the massive scale enabled by random placement methods such as conventional fluidic assembly but with the precision and selective assembly capabilities of deterministic methods.

Modifications to at least one of the fluidic self-assembly methods described above have been proposed in an attempt to meet this need. For example, in one approach, conventional fluidic assembly techniques have evolved that use differently shaped micro-components that are adapted to engage differently shaped receptor sites on a substrate. This requires that the substrate has binding sites that are uniquely shaped to correspond to a shape of a particular type of micro-component. However, the constraints of surface etching techniques, micro-component formation techniques, cost, electrical function, and orientation limit the number of shape configurations that are available for use in discrimination, which in turn limits the number of different components that can be placed on the substrate using such a process.

In another approach, Bashir et al. discuss the use of binding between complementary DNA molecules or ligands to discriminate between binding sites. While this approach provides a high degree of differentiation high cost may be encountered in patterning the DNA or ligands on the substrate. (H. McNally, M. Pingle, S. W. Lee, D. Guo, D. Bergstrom, and R. Bashir, "*Self-Assembly of Micro and Nano-Scale Particles using Bio-Inspired Events*", *Applied Surface Science*, vol. 214/1-4 pp 109-119, 2003).

Thus, there is a need for a more cost effective method for the high volume heterogeneous assembly of micro-components.

SUMMARY OF THE INVENTION

In one aspect of the invention a method is provided for assembling micro-components to binding sites on a support and a pattern of electrical conductors adapted to conduct electrical energy between binding sites. In accordance with the method, an electrical signal is passed through at least one conductive path including at least one of the conductors so that heat is generated by a portion of each conductive path proximate to the binding sites, a first fluid is applied to the support that is adapted to increase in viscosity when heated, and, a carrier fluid having first micro-components adapted to engage the binding sites is applied to the support. Wherein the heat from the at least one conductive path increases the viscosity of the first fluid in areas proximate to the selected binding sites so as to inhibit first micro-components from engaging the binding sites.

In another aspect of the invention, a method is provided for assembling micro-components to binding sites on a support having a pattern of electrical conductors adapted to conduct electrical energy between binding sites. In accordance with the method, an electrical signal is passed through a first pattern of conductive pathways including at least one of the conductors so that a first pattern of heat is generated by the conductive pathways proximate to a first pattern of selected binding sites and a first fluid that is adapted to increase in viscosity when heated is applied to the support. A carrier fluid having first micro-components adapted to engage the binding sites is applied to the support. The carrier fluid, the first fluid and any of the first micro-components not engaged to a binding site are removed, from the support. A second electrical signal is passed through a second pattern of conductive pathways that includes at least one of the conductors and that is different from the first pattern so a second pattern of heat is generated by the conductive pathways proximate to a second pattern of selected binding sites. A second fluid that is adapted to increase in viscosity when heated is applied to the support and a second carrier fluid having second micro-components adapted to engage the binding sites is applied to the support. Wherein the first pattern of heat from the conductive pathways increases the viscosity of the first fluid proximate to the first pattern of selected binding sites so as to inhibit first micro-components from engaging the first pattern of selected binding sites; and wherein the second pattern of heat from the conductive pathways increases the viscosity of the second fluid proximate to the second pattern of selected binding sites so as to inhibit second micro-components from engaging the second pattern of selected binding sites.

In still another aspect of the invention, a support is provided. The support has a surface having binding sites thereon and electrical conductors positioned between the binding sites to define conductive pathways for use in an electrical circuit formed by micro-components to be located in the binding sites during an assembly process. The electrical conductors have portions that are adapted to generate heat proximate to selected binding sites when an electrical current is passed therethrough, and said electrical conductors having other portions adapted to produce less heat when an electrical signal is passed therethrough.

In another aspect of the invention, a support is provided a surface having binding sites thereon and electrical conductors positioned between the binding sites to define conductive pathways for use in an electrical circuit formed by micro-components to be located in the binding sites during an assembly process with different ones of the electrical conductors adapted to generate different levels of heat in response to an electrical signal so that different patterns of binding sites can be formed by applying the electrical signal to the substrate.

BRIEF DESCRIPTION OF THE DRAWINGS

FIG. 5a-5g show embodiments of the invention, wherein a set of energy absorbing heat producers are incorporated into a support proximate to selected binding sites;

FIGS. 11a-11h provide illustrations depicting the application of one embodiment or method and apparatus of the invention in the assembly of a display;

DETAILED DESCRIPTION OF THE INVENTION

Figure 1A:
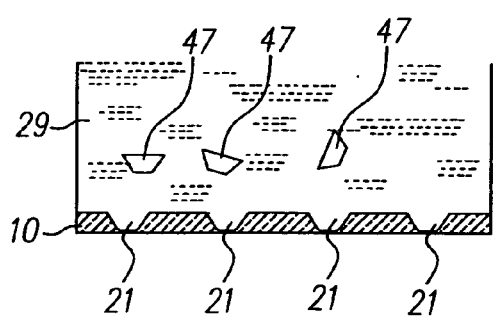
FIGS. 1a-1e illustrate various types of methods that are known in the prior art for fluidic self-assembly.
Figure 1B:
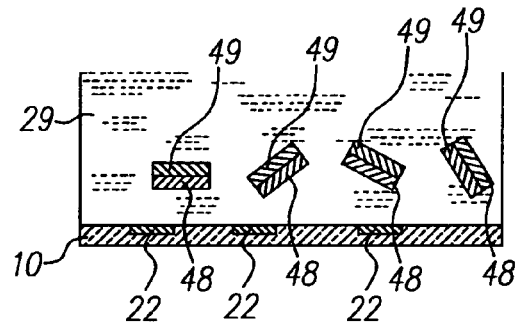
Figure 1C:
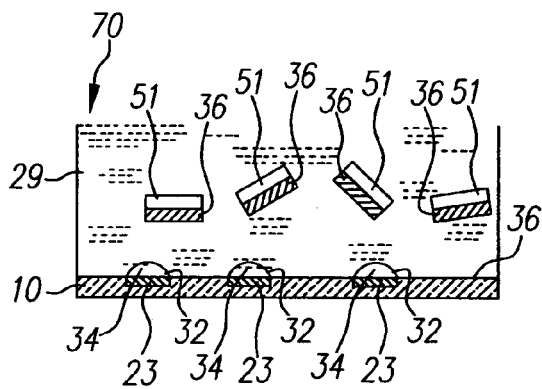
Figure 1D:
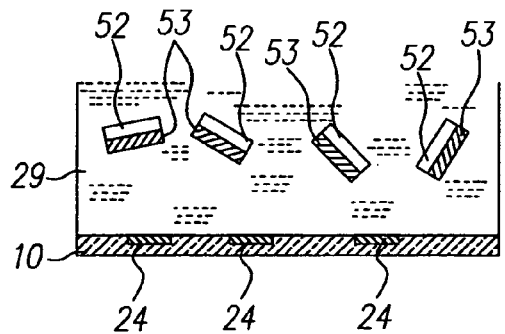
Figure 1E:
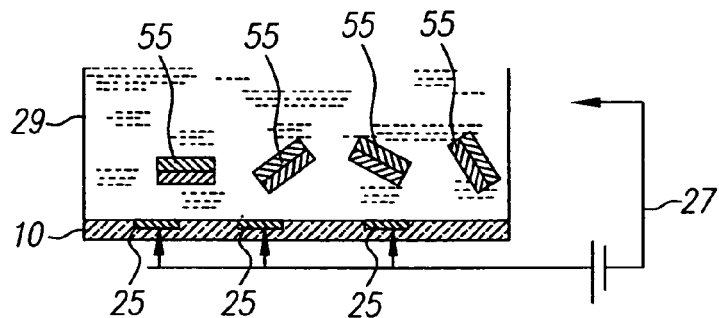
Figure 2A:
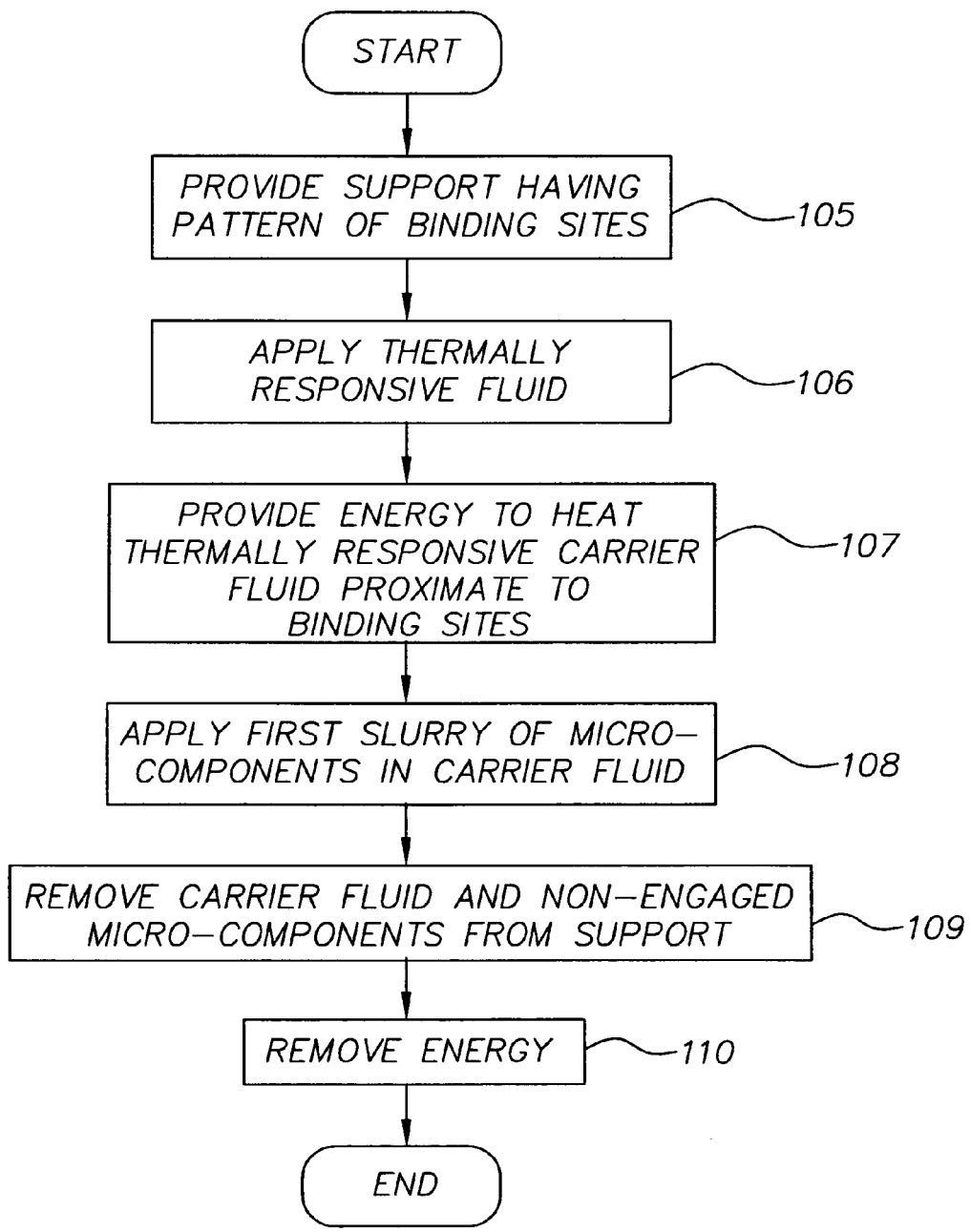
FIG. 2a is a flow diagram of one embodiment of the method of invention.
Figure 3A:
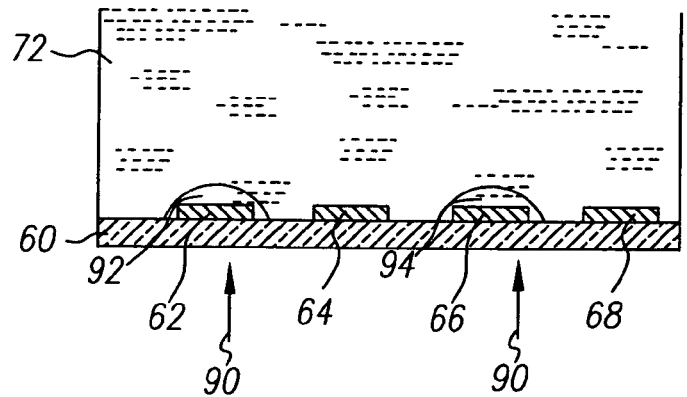
FIGS. 3a-3c illustrate fluidic self-assembly in accordance with the method of FIGS. 2a and 2b.
Figure 3B:
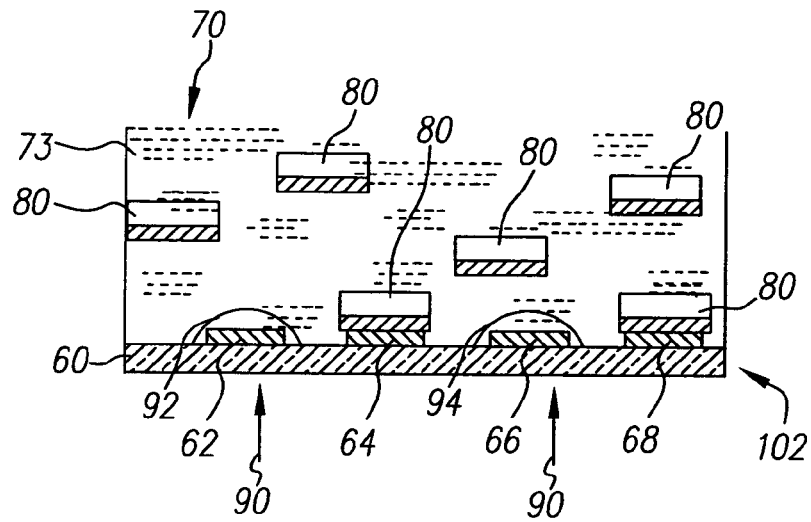

FIG. 2a is a flow diagram of one embodiment of the method of invention. FIGS. 3a and 3b illustrates one example of fluidic self-assembly in accordance with the method of FIG. 2a. As is shown in FIG. 3a, a support 60 is provided (step 105). Support 60 can be, but is not limited to, a flexible support such as polyethylene terephthalate, cellulose acetate, polyethylene, polycarbonate, polymethyl methacrylate, polyethylene napthalate, metal foils, cloth, fabric, woven fiber or wire meshes or rigid supports such as glass and silicon.

Figure 3C:
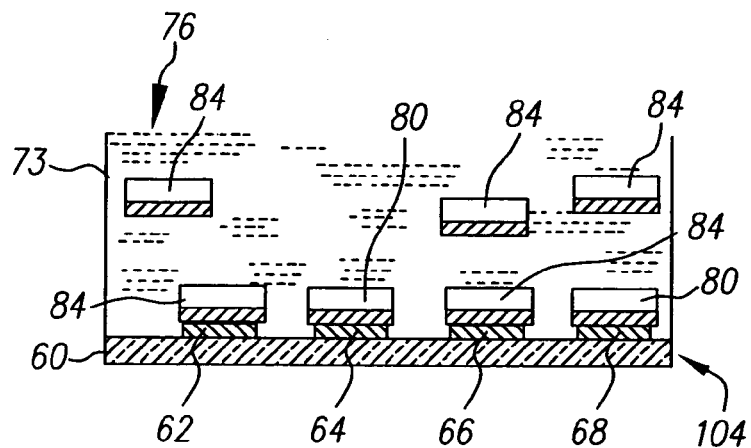

Support 60 has pattern of binding sites shown in FIGS. 3a-3c as binding sites 62, 64, 66 and 68. Each binding site 62, 64, 66 and 68 is adapted so that a micro-component can be assembled thereon, such as by shaping binding sites 62, 64, 66 and 68 to receive the micro-component. Alternatively, support 60 can have binding sites 62, 64, 66 and 68 that are adapted to engage micro-components using, for example, shape matching, magnetic force, electrical force, hydrophobic attraction, hydrophilic attraction, molecular recognition, and/or capillary attraction as described in the prior art.

In operation, a thermally responsive fluid 72 is applied to support 60 (step 106). In the embodiment shown in FIGS. 2 and 3a-3b this is done by flowing a thermally responsive fluid 72 across support 60. However, in other embodiments, thermally responsive fluid 72 can be applied to support 60 in other ways such as by immersing support 60 in a bath of thermally responsive fluid 72.

As used herein, the term thermally responsive fluid is used to mean a fluid that increases its viscosity upon heating. Examples of useful thermally responsive fluids include, but are not limited to, concentrated aqueous solutions of polymers, polysaccharides, or combinations thereof that increase viscosity upon heating. Useful polymers can include poly(ethylene oxide) (PEO), and poly(propylene oxide) (PPO) or a PEO-PPO copolymer surfactant (poloxamers). Poloxamer solutions are thermal gels with gel transition temperatures that can be tuned by concentration and type of poloxamer. PEO-PPO-PEO surfactants such as Pluronic® surfactants are commercially available from BASF Corp. that can be useful as a thermally responsive fluid for thermally controlled fluidic self-assembly. Other thermally responsive fluids can include aqueous solutions of: morpholine ethyleneoxide methacrylate, glycol derivatives, copolymers of morpholine ethyleneoxide methacrylate with polyethylene, polypropylene glycol derivatives, polysaccharides such as glycan or xyloglucan gels, and methylcellulose-polyethylene glycol-citric acid ternary system.

The useful range of poloxamer surfactants in solution depends on the gel transition temperature required. For example, for Pluronic® F127 fluid, the preferred concentration range for gel transition temperature of 45-50° C. is 8-20 wt %. For a Pluronic® P85 the preferred concentration is about 15 wt % for gel transition temperature of about 70° C. For Pluronic® L62 the preferred concentration is about 25 wt % for gel transition temperature of about 46° C. For Pluronic® F87 the preferred concentration is about 22 wt % for gel transition temperature of about 38° C.

Still other examples of a thermally responsive fluid include aqueous solutions of morpholine ethyleneoxide methacrylate and copolymers of morpholine ethyleneoxide methacrylate with polyethylene and polypropylene glycol derivatives. U.S. Pat. No. 5,955,515, entitled "Water-Based Ink for Ink-Jet, and Ink-Jet Recording Method and Instruments Using the Ink", filed by Kimura, et al. on Sep. 26, 1995, describes the following examples of morpholine ethylenoxides and corresponding temperatures at which the examples convert into a gel:

TABLE 1

Heat-reversible type thickening polymers used in examples

| | Kind of polymer | Molecular weight | Viscosity of 10% aq. solution (mPa.s 25° C.) | Transition temperature (° C.) |
|---|---|---|---|---|
| A | Polymer of morpholine-ethyl methacrylate | 1,000,000 | 110 | 30 |
| B | Polymer of 2-(2-morpholinemethoxy) ethyl methacrylate | 300,000 | 15 | 40 |
| C | Polymer of morpholine ethylene oxide (3 mol) methacrylate | 1,000 | 3 | 55 |
| D | Polymer of morpholine ethylene oxide (3 mol) methacrylate | 300,000 | 12 | 55 |
| E | Polymer of 2,5-dimethylmorpholine ethylene oxide (4 mol) methacrylate | 40,000 | 7 | 75 |
| F | Polymer of morpholine ethylene oxide (5 mol) methacrylate | 80,000 | 10 | 85 |
| G | Copolymer of morpholine ethylene oxide (3 mol) methacrylate-n-morpholinepolyethylene glycol (10 mol)-poly-propylene glycol (22 mol) polyethylene glycol (10 mol) mono-methacrylate | 40,000 | 3 | 45.55 |

In still other embodiments, a thermally responsive fluid can comprise solutions of xyloglucan gels such as aqueous solutions of xyloglucan polysaccharide that have been partially degraded by B-galactosidase to eliminate 44% of galactose residues form gels at concentrations of 1.0-1.5 w/w at 37° C.

In yet another embodiment, a thermally responsive fluid can comprise an aqueous solution of a methyl cellulose-polyethylene glycol-citric acid ternary system: with from is 0-10% polyethylene glycol (PEG), 0.1-3% methyl cellulose (MC), and 0.1-10% citric acid (SC). Preferably the molecular weight of the PEG is 1000-100,000 daltons, but most preferably 3,000-6,000 daltons. Most preferred formulation for a gel transition temperature of 38-46° C. is 0-2% PEG (Mw=4000), 1.0 wt % MC and 3.5 wt % SC, adjusted to pH of 5.

The aqueous solutions described herein can include but are not limited to alcohols and polyethylene glycol. Non-aqueous solutions can also be used. For example, a thermally responsive fluid can be provided that incorporates chlorinated solvents and other non-aqueous solvents.

Energy 90 is applied to heat thermally responsive fluid 72 in areas in and/or near selected binding sites on support 60, shown in FIGS. 3a and 3b embodiment as binding sites 62 and 66 (step 107). Energy 90 can be applied to thermally responsive fluid 72 in an indirect fashion or it can be applied in a direct fashion. FIGS. 3a-3c illustrate an example of indirect heating of thermally responsive fluid 72. In the example shown in FIG. 3a, energy 90 is supplied to support 60 in areas proximate to selected binding sites 62 and 66. In response to the application of energy 90, heat is generated in support 60 in areas proximate to selected binding sites 62 and 66. The heat generated by support 60 in these areas spreads into thermally responsive fluid 72. Thermally responsive fluid 72 reacts to this heat by increasing viscosity. This creates barrier zones 92 and 94 within thermally responsive fluid 72 having a viscosity that is higher than the viscosity of other areas of thermally responsive fluid 72. Barrier zones 92 and 94 in certain embodiments can comprise fluid, gelatinous, or solid forms of first thermally responsive fluid 72. Barrier zones 92 and 94 interfere with the ability of micro-components 80 to engage binding sites 62 and 66.

Accordingly, as is shown in FIG. 3b, after barrier zones 92 and 94 have been formed at binding sites 62 and 66, a first slurry 70 of a carrier fluid 73 and a first type of micro-components 80 are applied to support 60 (step 108). Carrier fluid 73 can comprise any fluid that can carry micro-components 80 to support 60 and be usefully applied for fluidic self-assembly. In one embodiment, carrier fluid 73 comprises a thermally responsive fluid. In one embodiment, the step of applying a thermally responsive fluid (step 106) providing energy to form barrier zones (step 107) and applying a first slurry (step 108) can be integrated such that the first slurry is applied by introducing first micro-components 80 into the thermally responsive fluid 72 already applied in step 106. However, this is not necessary and carrier fluid 73 does not, in itself, have to comprise a thermally responsive fluid. This can be done where the barrier zones 92 and 94 formed in first fluid 72 will persist during application of carrier fluid 73.

Micro-components 80 can include, but are not limited to, integrated circuits on silicon, nanowires, beads, rods, cubes, disks, buckey balls, capsules, electrophoretic beads, LEDs, light emitting materials, light reflecting materials, light absorbing materials, conductive materials, magnetic materials, dielectric materials, aerogels, biological cells, DNA and DNA derivatives, and DNA templated structures. Micro-components 80 can be sized within any range of sizes that can effectively be suspended in solution in the thermally responsive fluid. In this regard, in selected embodiments, micro-components 80 can be sized as small as 1 nanometer, and as large as several millimeters.

The first type of micro-components 80 are adapted to engage binding sites 62, 64, 66 and 68 as is known generally in the art described above. However, in the illustration of FIGS. 3a-3c, it is not intended that the first type of micro-components 80 engage selected binding sites shown in this illustration as binding sites 62 and 66. Accordingly, barrier zones 90 and 92 inhibit such engagement. Specifically, it will be appreciated that micro-components 80 typically follow a path of least resistance as they move about in carrier fluid 73. Accordingly where micro-components 80 encounter barrier zones 92 and 94 of higher viscosity, micro-components 80 will be deflected away from barrier zones 92 and 94 and therefore will not engage binding sites 62 and 66. However, micro-components 80 are able to engage binding sites 64 and 68 which are not protected by barrier zones 92 and 94.

After first type micro-components 80 have been assembled to each of the non-selected sites 64 and 68, first carrier fluid 73 and any non-engaged first micro-components 80 are removed from first micro-assembled structure 100 (step 109). This can be done by mechanical action, by vacuum, or by rinsing, for example. In one embodiment, a liquid such as thermally responsive fluid 72 is rinsed over support 60 to remove any of the first type of micro-components 80 that remain on support 60 and that are not bound to one of binding sites 62, 64, 66 or 68. During removal of first slurry 70, energy 90 is supplied to the selected binding sites 62 and 66 to prevent any non-engaged micro-components 80 of the first type from binding to the selected sites 62 and 66. The supply of energy 90 to binding sites 62 and 66 can be terminated after removal is complete (step 110). When energy 90 is terminated, temperature increases dissipate proximate to binding sites 62 and 66 and barrier zones 92 and 94 that are created as a result of such local temperature increases also dissipate. The first micro-assembled structure 100 is formed as a result of the union of the first type of micro-components 80 with support 60. This first micro-assembled structure 100 can, in some embodiments such as the embodiment of FIG. 2a, comprise a final micro-assembled structure 104.

Additional micro-components can also be assembled to first micro-assembled structure 100. FIGS. 2b and 3a-3c illustrate on embodiment of a method for assembling more than one micro-component to a support. The embodiment of FIG. 2b incorporates the method steps of FIG. 2a and adds additional steps 112-122. In accordance with the method of FIG. 2b, steps 105-110 are performed as described above. Then additional micro-components can be provide that are adapted to engage binding sites on support 60 in order to form an intermediate micro-assembled structure 102 or final micro-assembled structure 104 as described below. Such additional components can be the first type of micro-components 80 or, as shown in FIG. 3c, a final type of micro-components 84.

When it is determined that only one further assembly step is necessary to create a final micro-assembled structure 104 (step 112), a final slurry 76 of carrier fluid 73 having a final type of micro-component 84 is applied to first micro-assembled structure 100 (step 115). This enables a final type of micro-components 84 to engage binding sites 62 and 66 and thus form a final micro-assembled structure 104 as illustrated in FIG. 3c. Carrier fluid 73 and any final micro-components 84 are removed to create a final micro-assembled structure. Optionally, thermally responsive fluid 72 can be applied to first micro-assembled structure 100 (step 113), and energy is applied to thermally responsive fluid 72 to form barrier zones (not shown). Such barrier zones can be used to leave select binding sites unoccupied. The energy applied in optional step 114 is then removed (step 117).

Figure 2B:
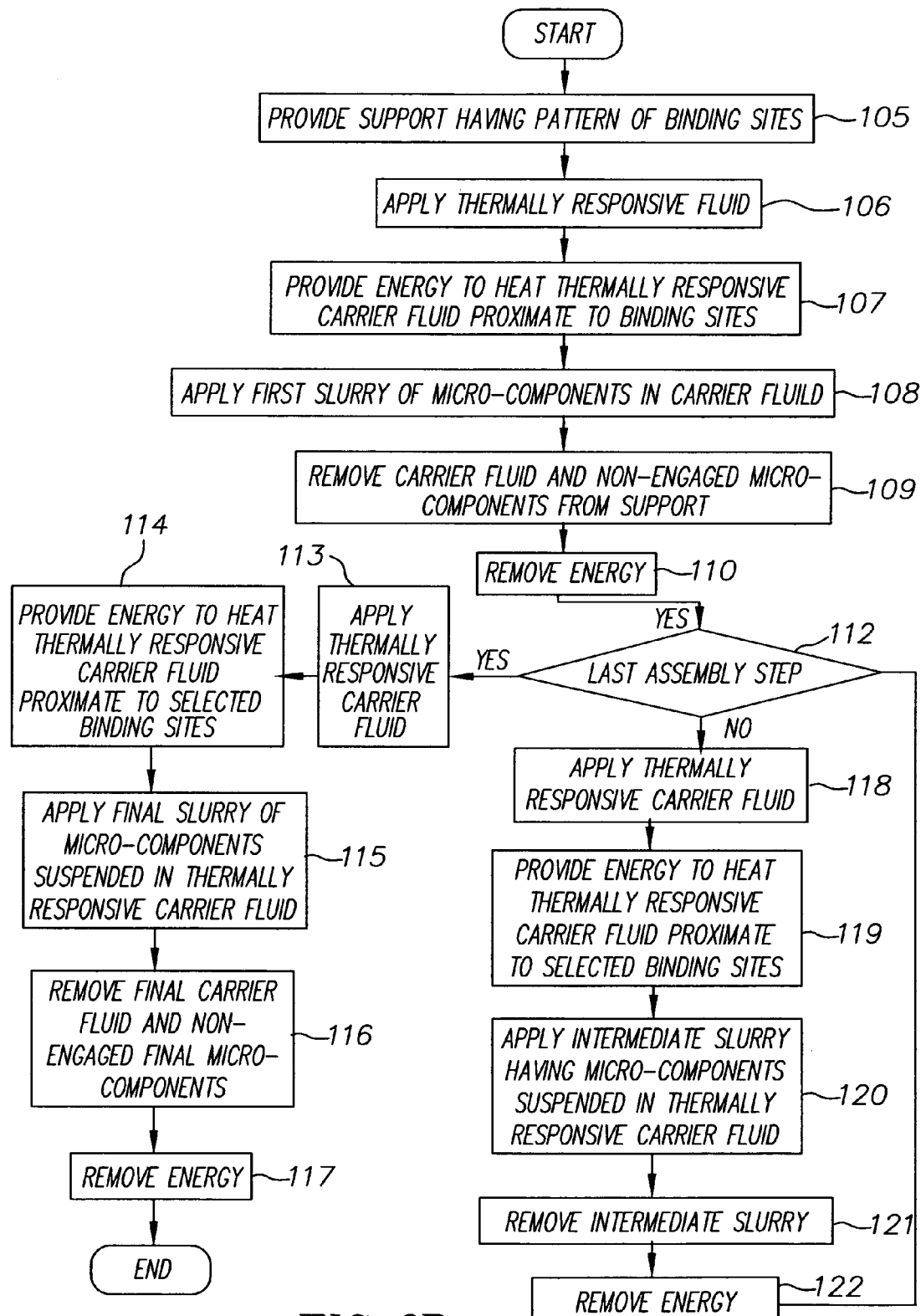
FIG. 2b is a flow diagram of another embodiment of the method of the invention for use in assembling several different types of micro-components.

When it is determined that more than two micro-assembly steps are to be performed (step 112), such as for example, where more than two different types of micro-components are to be joined to support 60, additional steps 118-122, shown in FIG. 2b are performed. FIGS. 4a-4d illustrate the operation of the method of FIG. 2b wherein these additional steps are performed.

Figure 4A:
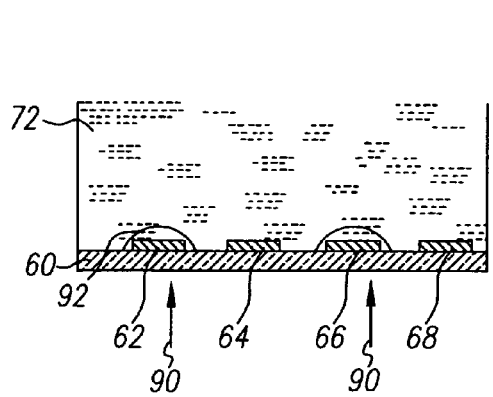
FIGS. 4a and 4b illustrate the assembly of a first type of micro-components 80 to a support 60 to form a first micro-assembled structure.
Figure 4B:
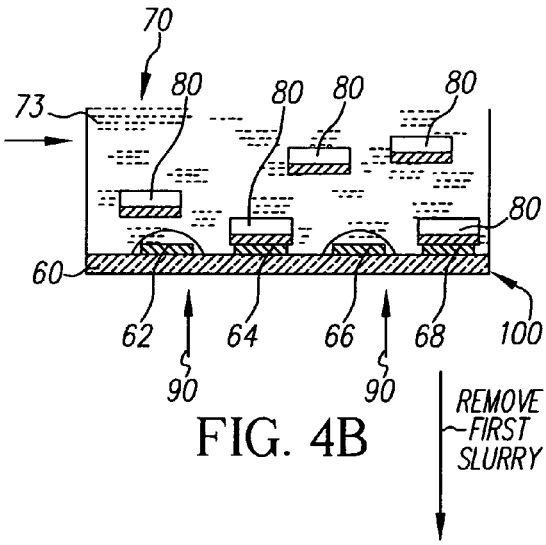
Figure 4D:
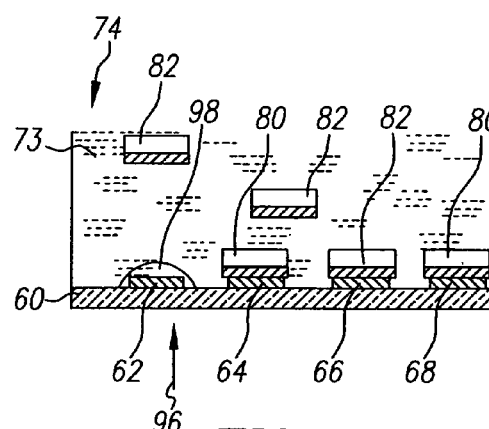
FIG. 4c and 4d illustrate the assembly of an intermediate type of micro-component to first micro-assembled structure to form an intermediate micro-assembled structure.
Figure 4C:
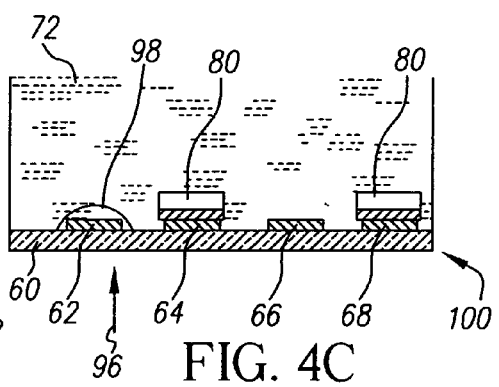

FIGS. 4a and 4b illustrate the assembly of a first type of micro-components 80 to a support 60 to form a first micro-assembled structure 100 in the same manner as is described above with reference to FIGS. 3a-3b (steps 105-110). As shown in FIG. 4c, a thermally responsive fluid 72 is applied to micro-assembled structure 100 (step 118) and energy is applied to support 60 to form at least one barrier zone 96 (step 119). As shown in FIG. 4d, at least one intermediate slurry 74 comprising, a carrier fluid 73 and an intermediate type of micro-components 82 is then applied to support 60 (step 120). Energy 96 is also applied to cause thermally responsive fluid 72 of the intermediate slurry 74 to form at least one further barrier zone 98 proximate to, for example, binding site 62 (step 119). Because binding site 62 is insulated by barrier zone 98 and binding sites 66 and 68 are already engaged each with a first type of micro-component 80, only binding site 66 is available for fluidic assembly with intermediate type of micro-components 82. This forms an intermediate micro-assembled structure 102. The intermediate slurry 84 is then removed from support 60 (step 121) and energy is then removed (step 122). The process then returns for more assemblies of intermediate micro-components or for assembly of final micro-components 84 (steps 113-117).

Figure 4E:
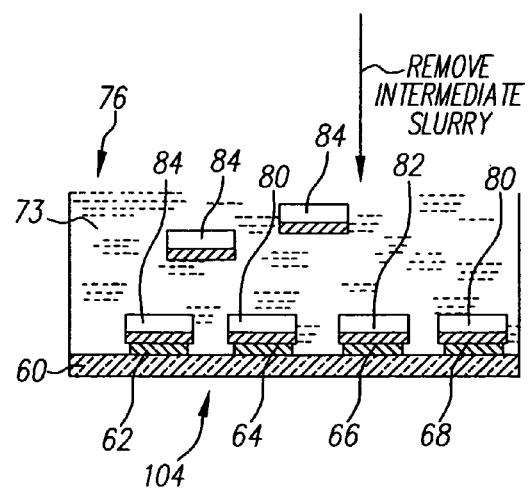
FIG. 4e illustrates the assembly of a final type of micro-component to the intermediate micro-assembled structure to form a final micro assembled structure.

Steps 111-122 can be repeated as necessary to permit many cycles of micro-assembly to occur, each with an additional application of an intermediate slurry 74 of a carrier fluid 73 bearing intermediate type micro-components 82 to a previously formed micro-assembled structure. In any of these additional steps, energy can be applied as necessary to form barrier zones. When it is determined that only one further assembly step is to be performed (step 112) steps 113-117 are performed to yield a final micro-assembled structure 104 as shown in FIG. 4e.

As used herein, the first, intermediate, and final types of micro-components can comprise the same structures and can be different as necessary to permit heterogeneous micro-assembled structure.

Energy Application

The steps of providing energy (steps 107, 114, and 119) can be performed in a variety of ways. As noted above, energy can be applied indirectly to thermally responsive fluid 72 by applying energy to support 60 or to some component of support 60 so that support 60 radiates heat. In certain embodiments, energy is broadly applied to support 60 and support 60 is adapted to react to this energy in a selective way, and to thereby selectively heat the thermally responsive fluid 72. In other embodiments, energy is selectively applied to selectively heat the thermally responsive fluid 72.

FIG. 5a-5g show embodiments of the invention, wherein a set of energy absorbing heat producers 132, 134, 136, and/or 138 are positioned in association with support 60 proximate to selected binding sites shown as binding sites 62-68. Energy absorbing heat producers 132, 134, 136, and 138 receive energy in the form of optical, electrical, microwave, sonic or other sources and convert this received energy into heat. Examples of such energy absorbing heat producers 132, 134, 136, and 138 include deposits of materials that are reactive to an energy field such as compositions and compounds that are capable of receiving energy and converting at least some of this energy into heat including, but not limited, to metals and dyes that are capable of absorbing electromagnetic radiation of predetermined wavelengths. Examples of such dyes include but are not limited to: cyanine dyes, tellurium adducts, oxonol dyes, squaraine dyes, merocyanine dyes, and metal dithiolenes. Other examples of such absorbing heat producers 132, 134, 136, and 138 include ferro-magnetic heaters, thermal transducers, and other such heat generating materials. In the example shown in FIG. 5a, energy 90 is applied to energy absorbing heat producers 132 and 136 which, in turn, radiate heat through support 60 and into thermally responsive fluid 72 proximate to binding sites 62 and 66 to create barrier zones 92 and 94.

FIG. 5b shows another embodiment of a support 60 having an arrangement of energy absorbing heat producers 132, 134, 136, and 138. In this embodiment, energy absorbing heat producers 132, 134, 136, and 138 are positioned around and proximate to binding sites 62, 64, 66, and 68. Energy 90 is shown to be selectively applied to energy absorbing heat producers 132 and 136 in the manner described above with respect to FIG. 4a to achieve the formation of barrier zones 92 and 94. As is also shown in FIG. 5b, energy 90 can be applied to energy absorbing heat producers 132, 134, 136, and 138 by directing a beam of energy 90 through a slurry 70 of thermally responsive fluid 72 and micro-components 80.

FIG. 5c shows another embodiment of a support 60 having an arrangement of energy absorbing heat producers 132, 134, 136 and 138. Specifically, in the embodiment shown in FIG. 5c, each of binding sites 62, 64, 66 and 68 have an associated energy absorbing heat producer 132, 134, 136, and 138 that is located in a portion of support 60 that is at a bottom most portion of the binding sites 62, 64, 66 and 68. In this embodiment, when energy is applied to any of energy absorbing heat producers 132, 134, 136, or 138 the energy is converted into heat which is conducted into thermally responsive fluid 72. The heat increases the viscosity of the thermally responsive fluid 72 to form a barrier zones 92 and 94 that can interfere with the ability of a micro-component 80 to be assembled to binding sites 62 and 66 respectively.

FIG. 5d shows still another embodiment of a support 60 having an arrangement of energy absorbing heat producers 132, 134, and 136. In this embodiment, support 60 has an arrangement of binding sites 62, 64, and 66 each having a liquid 140 that is adapted to engage a liquid engagement surface 88 of a micro-component 80. Energy absorbing heat producers 132, 134, and 136 are positioned on support 60 proximate to binding sites 62, 64, and 66. Energy absorbing heat producers 132, 134, and 136 receive energy 90 and convert this energy into heat. For example, when energy 90 is applied to energy absorbing heat producer 132 heat is produced. When this heat is transferred into first thermally responsive fluid 72 a barrier zone 92 is formed that inhibits micro-components 80 from engaging liquid 140.

FIG. 5e shows another embodiment wherein support 60 has binding sites 62, 64, and 66 each having a liquid 140 associated therewith to engage a liquid engagement surface 88 of a micro-component 80. As is shown in FIG. 5e, in this embodiment, energy absorbing heat producers 132, 134, and 136 are positioned around and proximate to binding sites 62, 64, and 66.

FIG. 5f shows still another embodiment wherein a support 60 is used having binding sites 62, 64, and 66 each having a liquid 140 associated there with and provided to engage in liquid engagement surface 88 of a first micro-component 80. As is shown in FIG. 5f energy absorbing heat producers 132, 134, and 136 are positioned at binding sites 62, 64, and 66 respectively and are in direct contact with or immediately proximate to liquid 140. In this embodiment, when any of energy absorbing heat producers 132, 134, and 136 receive energy 90, heat is conveyed by way of liquid 140 to form a barrier zone 92 as described above.

Figure 5G:
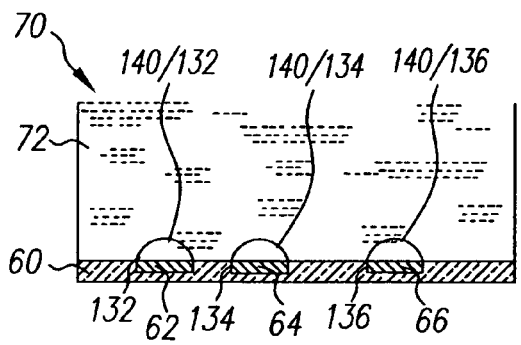

In any of FIGS. 5d, 5e or 5f, the energy absorbing heat producers can radiate heat in a manner that is intended to heat liquid 140 so that a barrier zone is formed based at least in part upon the heat from liquid 140. In still another embodiment shown in FIG. 5g, deposits of liquid 141 operate as an energy absorbing heat producer. This can be done by selecting a liquid 141 that can be energized as described above to radiate heat to form a barrier zone, or by adapting liquid 140 with a dye or other material that can absorb energy of a particular type and generate heat to form a barrier zone.

FIGS. 5h through 5n show embodiments wherein support 60 is adapted with binding sites 62, 64, 66, and 68 that are associated with energy absorbing heat producers 132, 134, and 136 that can convert the same level of exposing energy into different levels of heat.

In FIGS. 5h through 5n, this difference is used to enable selective micro-assembly at selective ones of binding sites 62, 64, 66 and 68 on support 60. In particular, this efficiency difference causes different ones of energy absorbing heat producers 132, 134, and 136 to attain the temperature for forming a barrier zone, while other ones of energy absorbing heat producers 132, 134, and 136 do not evolve heat sufficiently rapidly to attain the temperature for forming a barrier zone, in response to the application of the same energy. Controlling the characteristics of energy absorbing heat producers 132, 134, and 136 enables selecting which binding sites are filled and which form barrier zones to remain empty without specifically directing the energy to some sites but withholding it from others, such as by a scanning system or mask, as will be described in greater detail below, thereby allowing uniform energy delivery to all binding sites while providing discrimination.

Figure 5H:
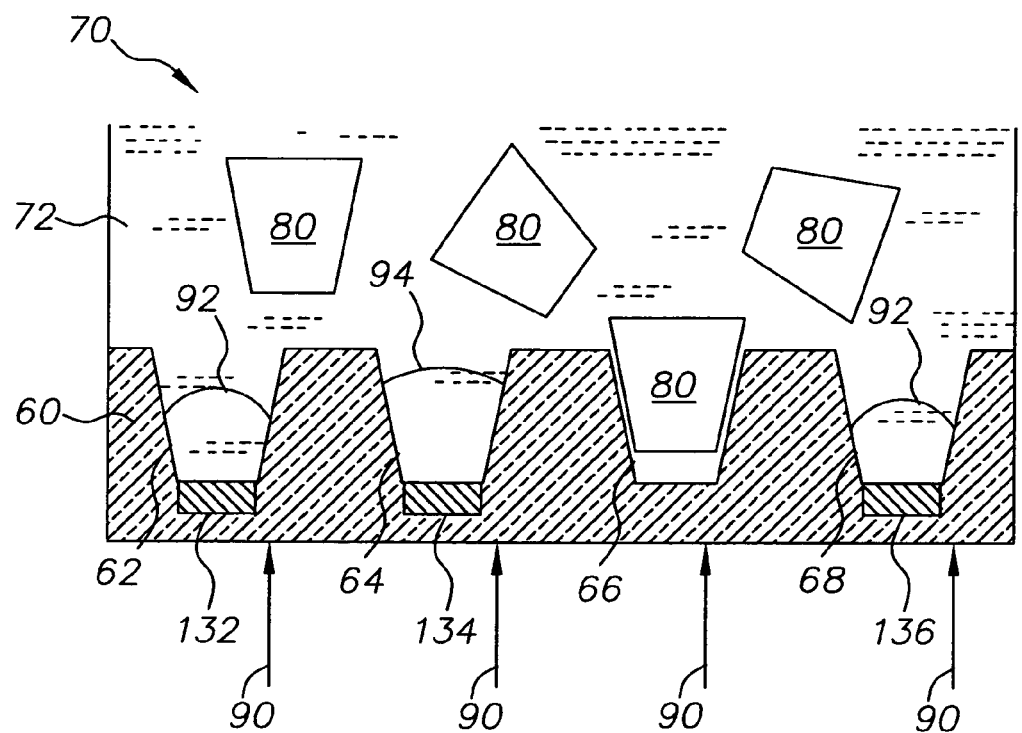
FIGS. 5h-5j show embodiments of the invention wherein a set of different energy absorbing heat producers are incorporated into a support proximate to selected binding sites
Figure 5I:
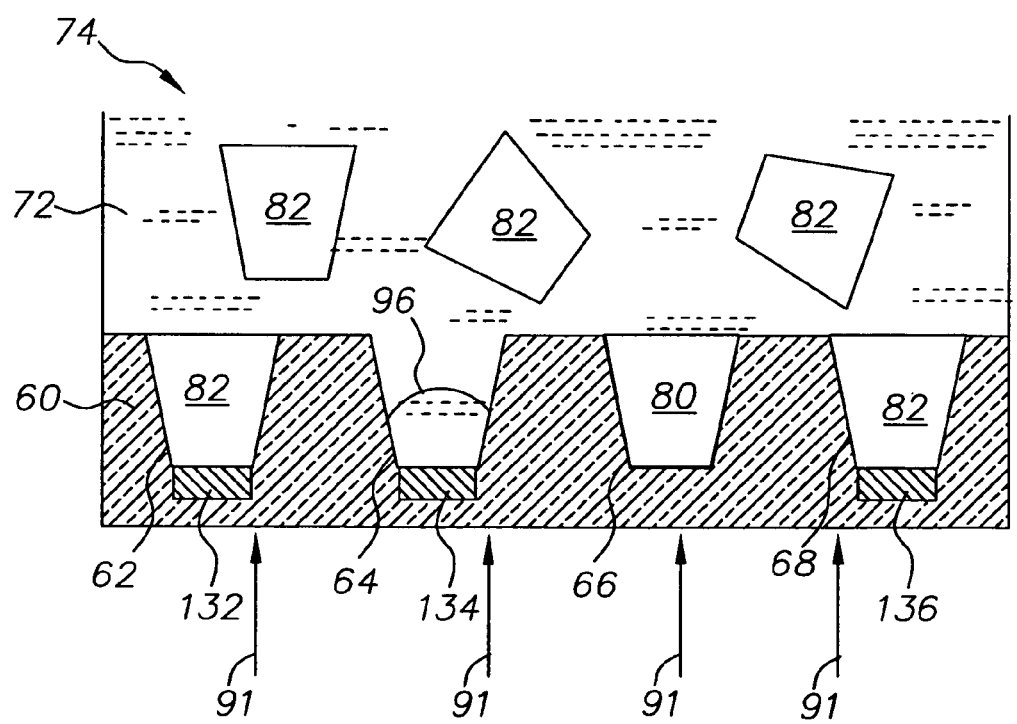
Figure 5J:
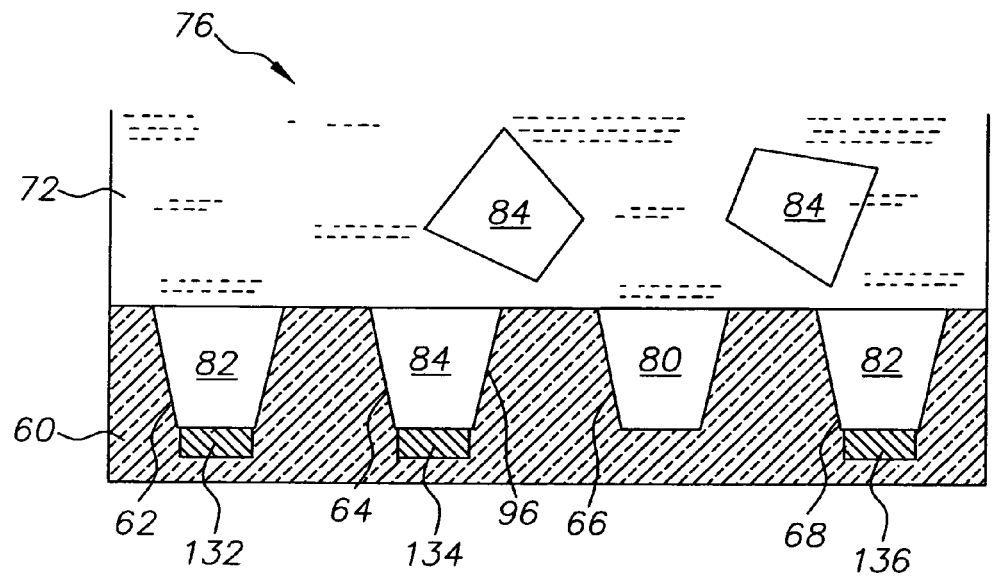

FIGS. 5h, 5i, and 5j illustrate how this can be done. In FIGS. 5h, 5i, and 5j, energy absorbing heat producers 134 convert a greater fraction of the incident energy than energy absorbing heat producers 132 and 136. FIG. 5h depicts a first step of an assembly process having this arrangement of energy absorbing heat producers 132, 134, and 136 on a support 60. As is shown in FIG. 5h, a uniform exposure of energy is applied at all binding sites 62, 64, 66, and 68 of support 60 either before or during exposure of support 60 to a first slurry 70 of thermally responsive fluid 72 having first micro-components 80 therein. The exposure, which can be measured as the temporal rate of energy delivered to an area of support 60, is established so that less efficient energy absorbing heat producers 132 and 136 form barrier zones 92 and 96 and so that the efficient energy absorbing heat producers 134, also form barrier zones 94. Accordingly, first type of micro-components 80 engage only binding sites 66 lacking heat producers.

FIG. 5i illustrates a second assembly step. In this assembly step, support 60 receives a lower energy exposure 190 that is adequate for the more efficient energy absorbing heat producers 134 to form a barrier zone 96 but that is inadequate for the less efficient energy absorbing heat producers 132 and 136 to form barrier zones so that introduction of an intermediate slurry 74 having second or intermediate micro-components 82 therein allows the intermediate type of micro-components 82 to engage binding sites 62 and 68 that correspond to the less efficient energy absorbing heat producers 132 and 136.

FIG. 5j illustrates yet another assembly step, such as a final assembly step. In this step, the exposure of support 60 to energy is too low to cause the more efficient energy absorbing heat producers 134 to form barrier zones and allows a final slurry comprising final type of micro-component 84 in a carrier fluid 76 to attach to binding sites 64 corresponding to those more efficient heat producers 134.

Dependence of the absorbance of the energy absorbing heat producers upon the spectral constitution of the energy, rather than gradation of that absorbance, can confer discrimination. For energy sources such as optical radiation electromagnetic radiation or sound, the frequency of oscillations of the energy determines its coupling to the energy absorbing heat producers. Discrimination can be conferred upon sites by making at least two types of energy absorbing heat producers with differing absorption spectra, then adjusting the oscillating frequency content of the energy source when the slurries are switched so that both types of energy absorbing heat producers form protective barriers with the first nominally uniform exposure but only one of the types of energy absorbing heat producers absorbs enough energy at a sufficiently rapid rate at the second exposure's oscillating frequency to radiate sufficient heat to form a barrier zone in a thermally responsive fluid.

Figure 5K:
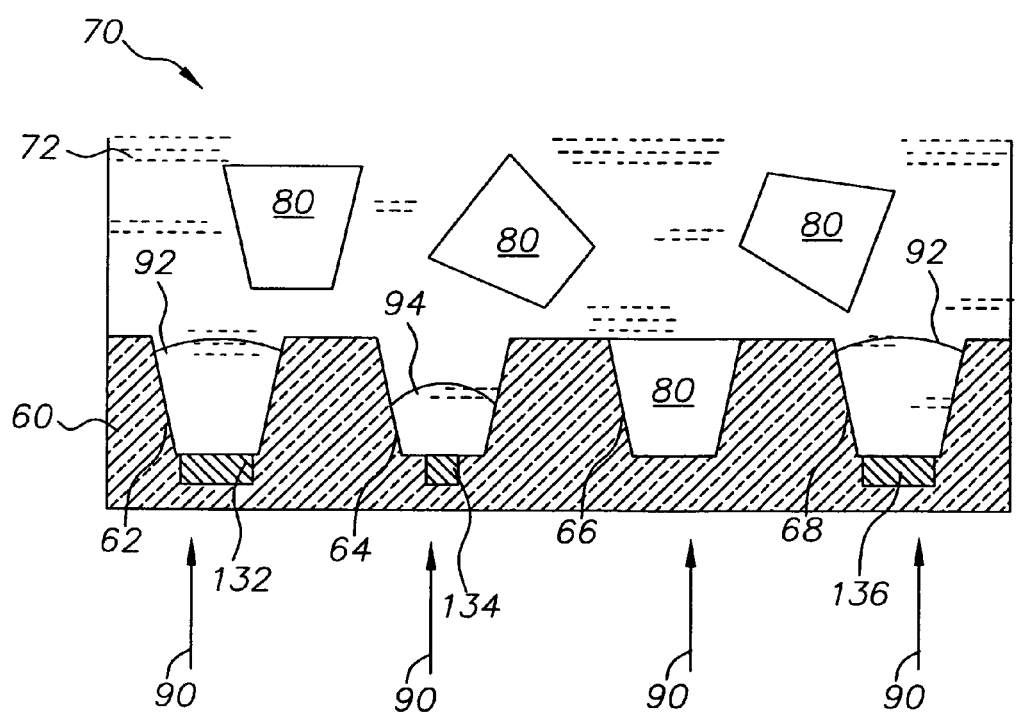
FIGS. 5k-5m illustrate micro-assembly using another embodiment of a support having a set of different energy absorbing heat producers.
Figure 5L:
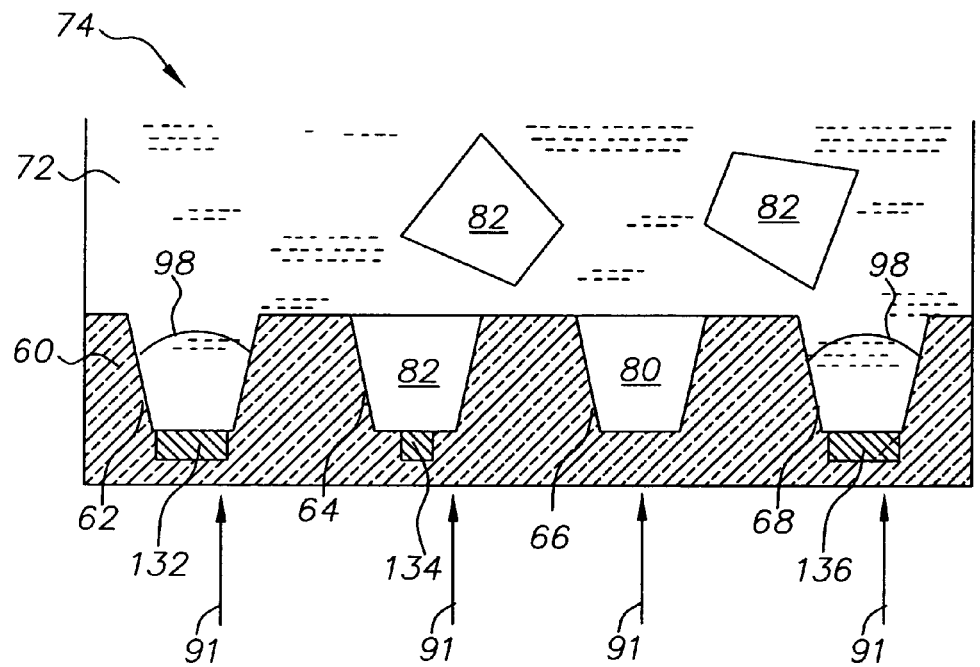
Figure 5M:
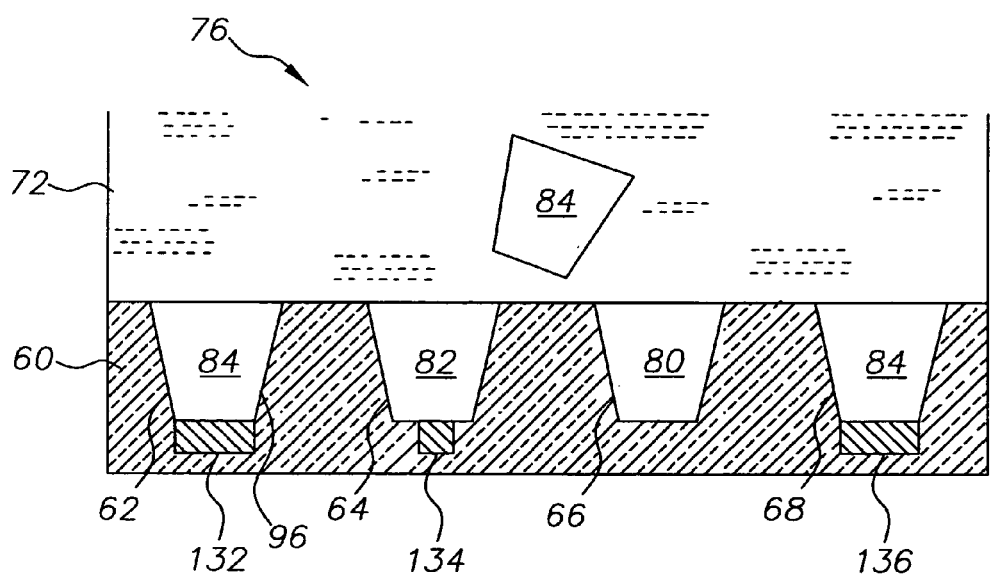

FIGS. 5k-5m depict another embodiment of a support 60 having an arrangement of energy absorbing heat producers 132, 134, 136, and 138 that respond to the a uniform exposure to energy by producing different amounts of heat. In this embodiment, energy absorbing heat producers can be provided on support 60 that have the same absorptivity but can provide discrimination. Accordingly, such energy absorbing heat producers of differing types can all be fabricated from the same material and can be the same thickness. This simplifies the production of the energy absorbing heat producers and control of the location of their mounting to the support 60.

Discrimination is accomplished in this embodiment by using an arrangement of energy absorbing heat producers having a different sizes to selectively control the amount of electromagnetic, optical, acoustic or other energy, limiting the rate of energy available for heating a thermally responsive fluid in a slurry to produce a barrier zone. The spatial distribution of the flow of heat away from the energy absorbing heat producer into cooler regions of the slurry determines the profile of elevated temperature surrounding each energy absorbing heat producer. Sufficient exposure 90 can cause an energy-absorbing heat producer to produce a barrier beyond the lateral extent of that heat producer.

FIGS. 5k-5m show one embodiment of this arrangement of energy absorbing heat producers. In the embodiment shown in FIGS. 5k-5m 132 and 136 are shown that cover substantially all of the bottom surface of binding sites 62 and 68, but energy absorbing heat producer 134 with only a fraction of the lateral extent of energy absorbing heat producers 132 and 136. Binding site 66 has no energy absorbing heat producers 134. In a first step of an assembly process using support 60 shown in FIG. 5l, a first uniform exposure of energy 90 is provided that is sufficient for smaller energy-absorbing heat producer 134 to produce a barrier zone 94 of adequate extent to protect its corresponding binding site 64 from attaching a first type micro-component 80 upon introduction of first slurry 70, while the wider energy absorbing heat producers 132 and 136 form barrier zones 92 and 96 to protect associated binding sites 62 and 68, so that only binding site 66 with no absorbers are filled with first micro-component 82.

FIG. 5l shows support 60 of FIG. 5k exposed to a second slurry 74 having a second type of micro-components 82 therein, with and exposed to a second, lower level, of energy 91 that is adequate for the wider energy absorbing heat producers 132 and 136 to form intermediate barrier zones 98. However, the laterally smaller energy absorbing heat producer 134 does not generate enough heat to cause a barrier zone to form or may form a barrier zone that is too small to prevent adhesion of the intermediate type of micro-component 84 to binding site 64, so each site associated with a laterally smaller energy absorbing heat producer can be filled by the intermediate type of micro-component 84 upon introduction of second slurry 74.

FIGS. 5k-5m show one embodiment of this arrangement of energy absorbing heat producers 132, 134 and 136. In the embodiment shown in FIGS. 5k-5m, energy absorbing heat producers 132 and 136 are shown that cover substantially all of the bottom surface of binding sites 62 and 68, while energy absorbing heat producer 134 covers only a fraction of the lateral extent of energy absorbing heat producers 132 and 136. Binding site 66 has no energy absorbing heat producers 134. In a first step of an assembly process using support 60 shown in FIG. 5l, a first uniform exposure of energy 90 is provided that is sufficient for smaller energy-absorbing heat producer 134 to produce a barrier zone 94 of adequate extent to protect its corresponding binding site 64 from attaching a first type micro-component 80 upon introduction of first slurry 70, while the wider energy absorbing heat producers 132 and 136 form barrier zones 92 and 96 to protect associated binding sites 62 and 68, so that only binding site 66 with no absorbers are filled with first micro-component 82.

Figure 5N:
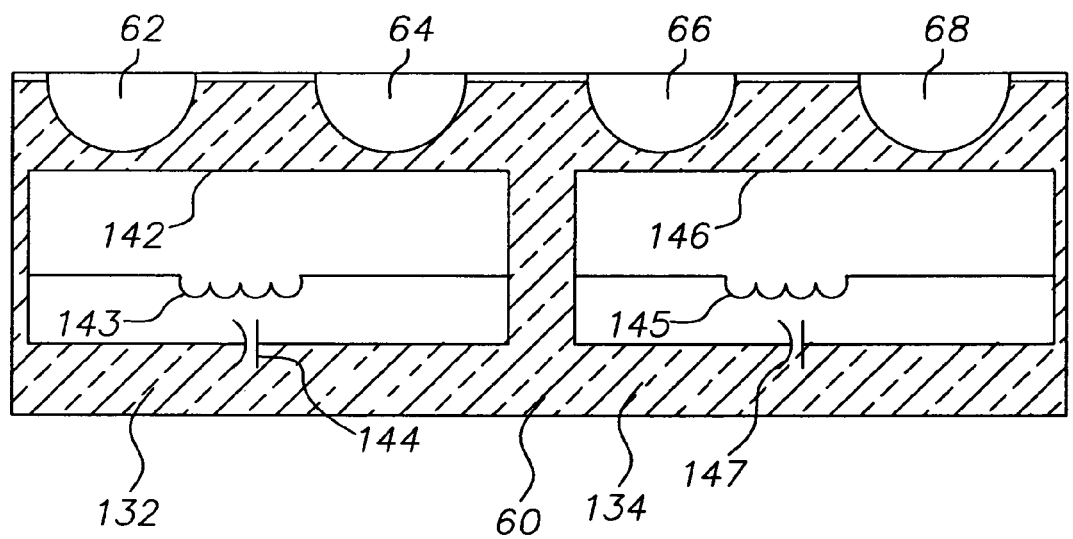
FIG. 5n illustrates one embodiment of the invention wherein a support is provided energy absorbing heat producers.

FIG. 5n shows yet another embodiment of a support 60 that has energy absorbing heat producers 132 and 134 that are adapted to convert electromagnetic signals into heat. Specifically, in the embodiment shown in FIG. 5n energy absorbing heat producer 132 comprises an inductor 143, a conductive heating portion 142 and an optional capacitor 144 while energy absorbing heat producer 134 comprises an inductor 145, a conductive heating portion 146 and an optional capacitor 147. Inductors 143 and 145 are adapted to generate electricity when exposed to a changing electromagnetic field such as a radio frequency or other field. Electricity that is generated in this fashion is passed through conductive heating portions 142 and 146 respectively to heat the support and a thermally responsive fluid so as to create barrier zones.

Electrical circuits of this type found in energy absorbing heat producers 132 and 134 of FIG. 5n can be tuned to be more sensitive to specific frequencies of radio frequency or other electromagnetic radiation using capacitors 144 and 147 in parallel with the inductors 143 and 145 respectively, so that they are responsive to particular frequencies. In this way, energy absorbing heat producers 132 and 134 can be made to be most efficient in converting energy into heat when exposed to electromagnetic fields at different frequencies so that during assembly the oscillating frequency content of the energy applied to support 60, can be adjusted it is possible to selectively activate one or the other, or both of energy absorbing heat producers 132 and 134 as desired.

It will be appreciated that in general it is possible to obtain with a first energy absorbing heat producer a different response to a frequency or other spectral characteristics of electromagnetic radiation or sound form of energy, or to the wavelength that is inversely proportion to the frequency of that form of energy, compared to the response of a second energy absorbing heat producer by fabricating the first energy absorbing heat producer from a different dye, pigment, metal or other material or combination of materials exhibiting a different absorption or combination of materials exhibiting a different absorption spectrum than the second energy absorbing heat producer does.

Figure 6A:
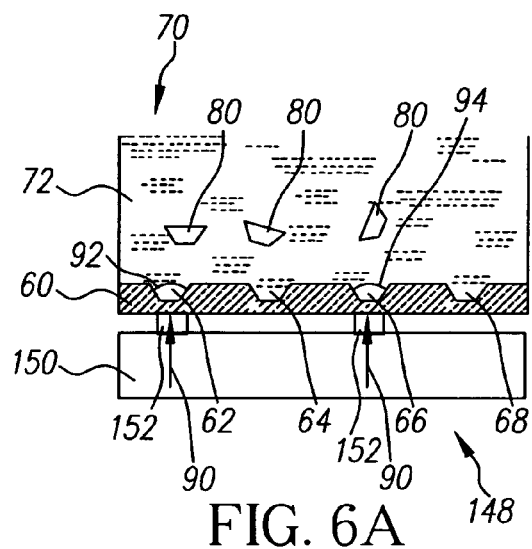
FIGS. 6a-6d illustrate various other embodiments of the invention wherein energy is selectively applied to cause localized heating of a carrier fluid.

FIGS. 6a-6d illustrate various other embodiments of the invention wherein energy as is selectively applied to cause localized heating of a thermally responsive fluid 72. As is shown in FIG. 6a, a support 60 is provided having binding sites 62, 64, 66, and 68. In this embodiment, support 60 is heated using a contact heater 148 comprising a patterned heating block 150 with projections 152 in contact with support 60 proximate to selected binding sites 62 and 66. The heat supplied by projections 152 of patterned heating block 150 selectively heats support 60 proximate to binding sites 62 and 66 to enable the formation of barrier zones 92 and 94 as described above.

Figure 6B:
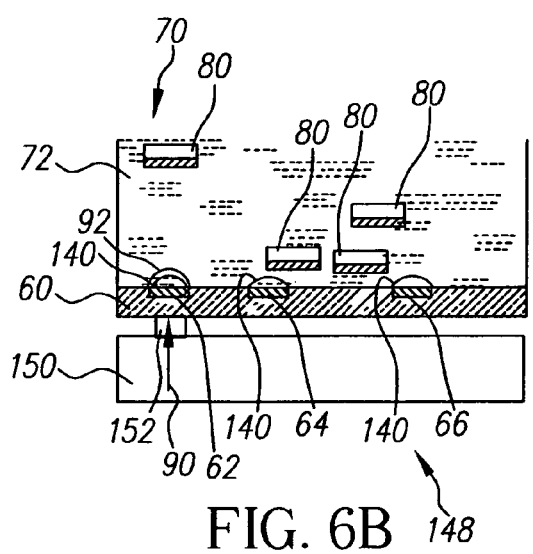

FIG. 6b illustrates the heating of a selected binding site 62 using contact heater 148 comprising a patterned heating block 150 with projections 152 to heat a support 60 having binding sites 62, 64, and 66 each associated with a liquid 140.

It will be appreciated that such a contact heater 148 can take many forms. For example, a heating block 150 of the type shown in FIGS. 6a and 6b take the form of a platen, roll, or other heated surface having projections 152 in the form of raised areas adapted to contact support 60 and to transfer heat thereto using a fixed pattern of projections 152.

Figure 6C:
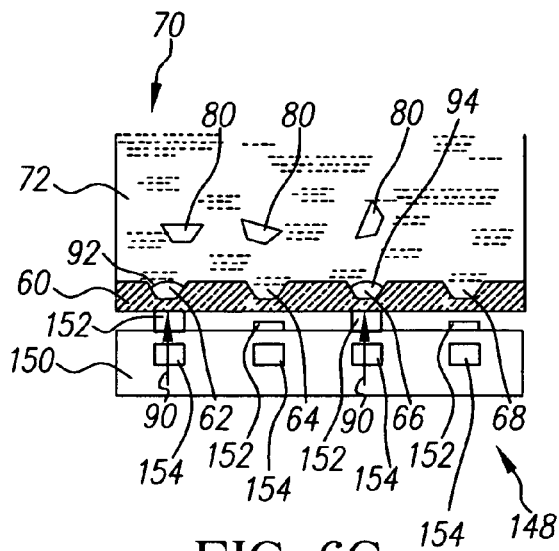

FIG. 6c shows a different embodiment of a heating block 150 having projections 152 in contact with support 60 and proximate to binding sites 62 and 66. In this embodiment, projections 152 have selectably addressable actuators 154 that bring projections 152 into and out of contact with support 60 on demand. In this way, during multiple assembly cycles, the pattern of heat applied to support 60 can be dynamically adjusted without moving either block 150 or support 60. In the embodiment shown, projections 152 have selectively addressable actuators such as electrically actuatable micro-motors or piezoelectric actuators that can selectively bring projections 152 into or out of contact with support 60 on demand.

Figure 6D:
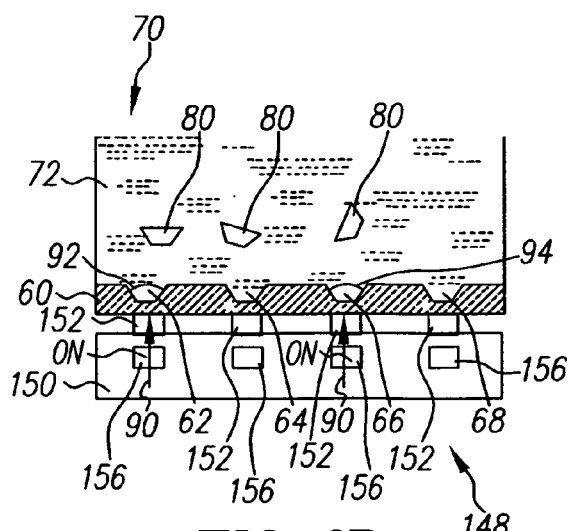

FIG. 6d illustrates the heating of selected sites using a heating block 150 having projections 152. In this embodiment, projections 152 are adapted to incorporate a selectively actuatable resistive energy absorbing heat producer 156 so as to permit dynamic adjustment of the pattern of heat applied to support 60.

Figure 7:
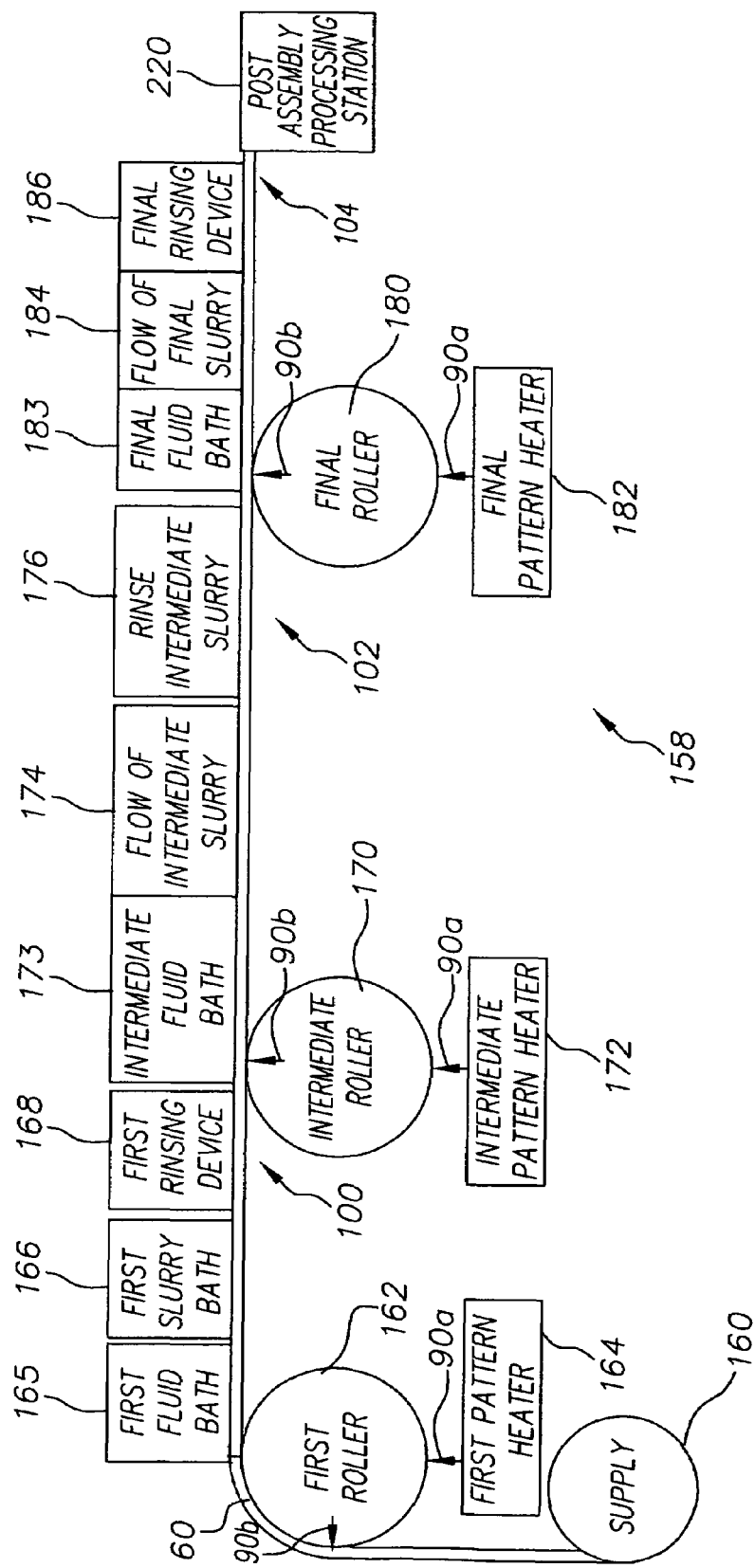
FIG. 7 shows an embodiment of an apparatus for assembling a micro-assembled structure in which energy can be applied selectively to a support and thereby to a thermally responsive fluid having micro-components therein in order to permit selective assembly.

FIG. 7 shows an embodiment of an apparatus 158 for assembling a structure in which energy can be applied selectively to support 60 and thereby to a thermally responsive fluid 72 in order to allow the formation of barrier zones to permit selective assembly as described above. FIG. 7 also shows using a web based continuous manufacturing process suitable for high-volume production. In this embodiment, a supply 160 provides a continuous web of support 60 having an arrangement of binding sites (not shown) thereon. The web of support 60 is passed across a first roller 162. First roller 162 is a thermal transfer roller. In this regard, first roller 162 is adapted to receive thermal energy 90a from a first pattern energizer 164 such as a laser or other source of thermal energy that can provide the desired pattern of thermal energy on first roller 162. In operation, first pattern heater 164 supplies a pattern of energy 90a to first roller 162 as first roller 162 rotates. When web of support 60 engages first roller 162, a corresponding pattern of heat 90b is transferred from first roller 162 to web of support 60.

After support 60 has been heated by heat 90b, support 60 is passed through a first bath 165. First bath 165 contains thermally responsive fluid 72. As thermally responsive fluid 72 is exposed to heat radiated by support 60, barrier zones are formed as described above. Support 60 with certain sites blocked by the barrier zones is passed through a first slurry bath 166. Alternatively, support 60 can be heated by transfer energy as it is passed through first bath 165.

First slurry bath 166 contains a first slurry 70 having micro-components, such as first micro-components 80, within carrier fluid 73 such as thermally responsive fluid 72. The barrier zones inhibit the first micro-components 80 from engaging selected binding sites. Micro-components 80 engage binding sites not protected by barrier zones to form a micro-assembled structure 100. As support 60 continues to move through the system 158 shown in FIG. 7, support 60 passes through a rinsing device 168 that removes residual amounts of first slurry 70 from support 60.

The web of support 60 then passes over at least one intermediate roller 170. In the embodiment shown, intermediate roller 170 comprises another thermal transfer roller that is adapted to receive energy 90a from an intermediate pattern energizer 172 and to transfer heat 90b to selectively heat web of support 60. After support 60 has been heated by heat 90b, support 60 is passed through an intermediate slurry bath 174. Intermediate slurry bath 174 has a carrier fluid 73, comprising in this embodiment, a thermally responsive fluid 72 containing intermediate type micro-components 82. Intermediate micro-components 84 are then permitted engage binding sites on micro-assembled structure 100 to form an intermediate micro-assembled structure 102. The type of thermally responsive fluid 72 used in the intermediate slurry bath 174 can be the same as or can be different than the type of thermally responsive fluid used in carrier fluid that is used in the first slurry bath 166.

As thermally responsive fluid 72 is exposed to heat radiated by support 60, barrier zones are formed as described above. These barrier zones inhibit intermediate micro-components 84 from engaging selected binding sites. Micro-components 84 engage binding sites not protected by barrier zones to form a micro-assembled structure 100. As support 60 continues to move through the system 158 shown in FIG. 7, support 60 passes through an intermediate rinsing device 176 that removes residual amounts of the first slurry from support 60.

Web of support 60 then passes over final roller 180. In the embodiment shown, final roller 180 comprises another thermal transfer roller that is adapted to receive energy 90a from a final pattern energizer 182 and to transfer heat 90b to selectively heat web of support 60. After support 60 has been heated by heat 90b provided by final roller 180, web of support 60 is passed through an final slurry bath 184. Final slurry bath 184 contains at least one final type of micro-component 86 within a carrier fluid 73 such as thermally responsive fluid 72. It will be appreciated however that the thermally responsive fluid 72 can be used in the intermediate slurry bath 184 can be the same as or can be different than the carrier fluid that is used in the first slurry bath 166 or in the second slurry bath 174.

As thermally responsive fluid 72 is exposed to heat from support 60, barrier zones are formed as described above. These barrier zones inhibit the final type micro-components 86 from engaging selected binding sites. Micro-components 84 engage binding sites not protected by barrier zones to form a final micro-assembled structure 104. As support 60 continues to move through the system 158 shown in FIG. 7, support 60 passes through a final rinsing device 186 that removes residual amounts of the first slurry from final micro-assembled structure 104. Support 60 and final micro-assembled structure 104 then pass to a post-assembly processing station 220 wherein support 60 and micro-assembled structure 104 are further processed for use, for example, by separating support 60 from micro-assembled structure 104 or by otherwise packaging or processing final micro-assembled structure 104.

It will be appreciated that once a pattern of energy is transferred to support 60, "hot spots" are formed on support 60 that have a finite lifetime because they cool by dissipating heat to their surroundings. A hot spot cools at a rate that depends primarily on the temperature difference between the hot spot and its surroundings including the thermally responsive fluid 72. In order to prolong the lifetime of a hot spot, a thermally responsive fluid 72 may be advantageously supplied at a temperature slightly below a transition temperature at which the viscosity of the thermally responsive carrier fluid undergoes meaningful change or transition of viscosity, such as a transition temperature at which thermally responsive carrier fluid 72 transitions from a liquid to a 92l so as to minimize the heat required to form a barrier zone 92 while at the same time reducing the temperature difference between the hot spot and its surroundings.

Figure 8A:
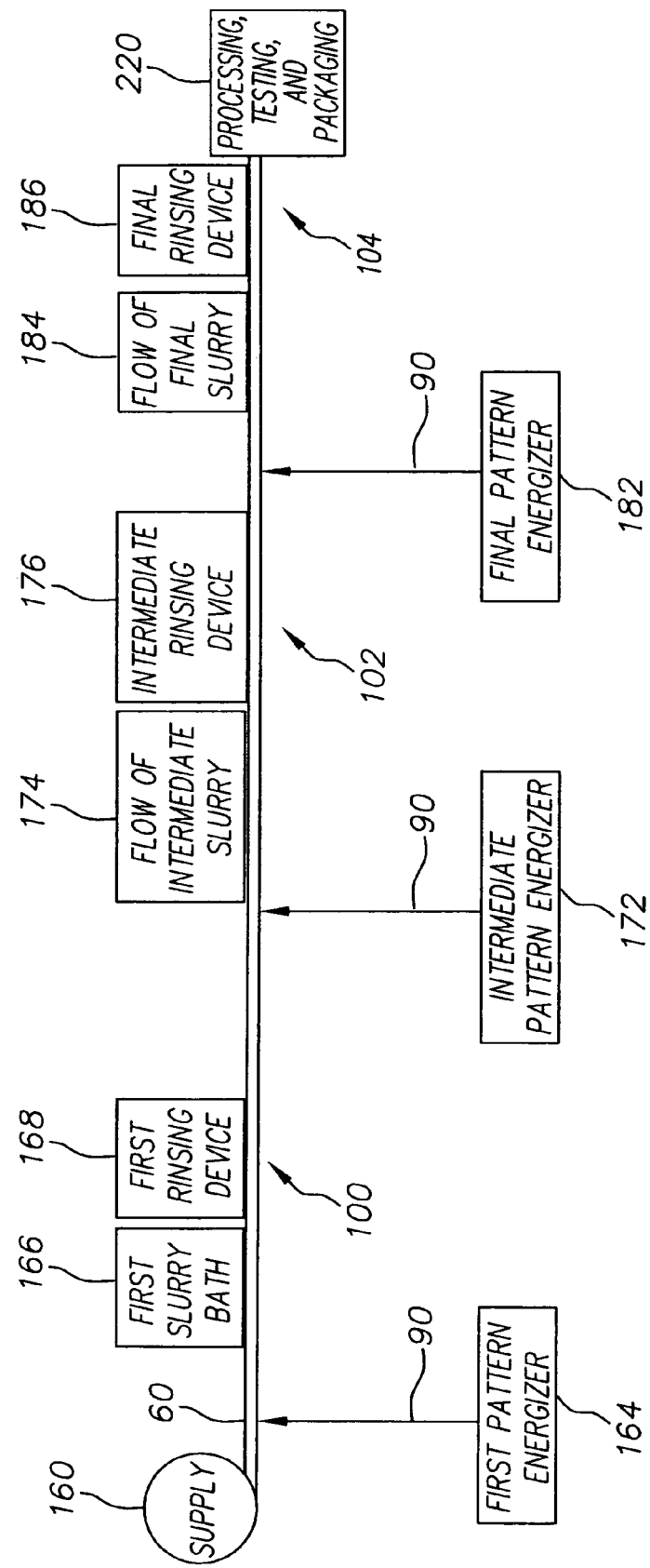
FIG. 8a shows an embodiment of an apparatus for assembling a micro-assembled structure in which energy can be applied selectively to a support and thereby to a thermally responsive fluid having micro-components therein in order to permit selective assembly.

Another embodiment that applies a pattern of energy to form barrier zones corresponding to selected binding sites on a support, is shown in FIGS. 8a-8f. As is shown in FIG. 8a, in this embodiment a continuous process is provided that does not include thermal transfer rollers 162, 170 and 180. Instead, in this embodiment, first pattern energizer 164, intermediate pattern energizer 172, and final pattern energizer 182 are adapted to directly apply a transfer energy 90b to support 60 to cause support 60 to radiate heat as described above. As is also shown in FIG. 8a, in this embodiment, intermediate pattern energizer 172 is shown directly applying energy 90 to heat a thermally responsive fluid 72 contained in intermediate slurry.

Alternatively, any of the patterned energizers 164, 172, or 182 can also comprise a thermal head. For example, a typical thermal head for use in the method of the present invention contains a plurality of adjacent, microscopic heat-resistor elements, which convert electrical energy via a joule effect into heat. Such thermal printing heads can be used in contact or, in close proximity with support 60 so as to transfer the heat generated thereby to support 60 or to a thermal transfer roller such as first roller 162, intermediate roller 170, or final roller 180. The operating temperature of common thermal printheads is in the range of 300 to 400 C and the heating time per element may be less than 1 ms, the pressure contact of the printhead with the material being, for example, 50-500 g/cm2 to ensure good heat transfer.

Figure 8B:
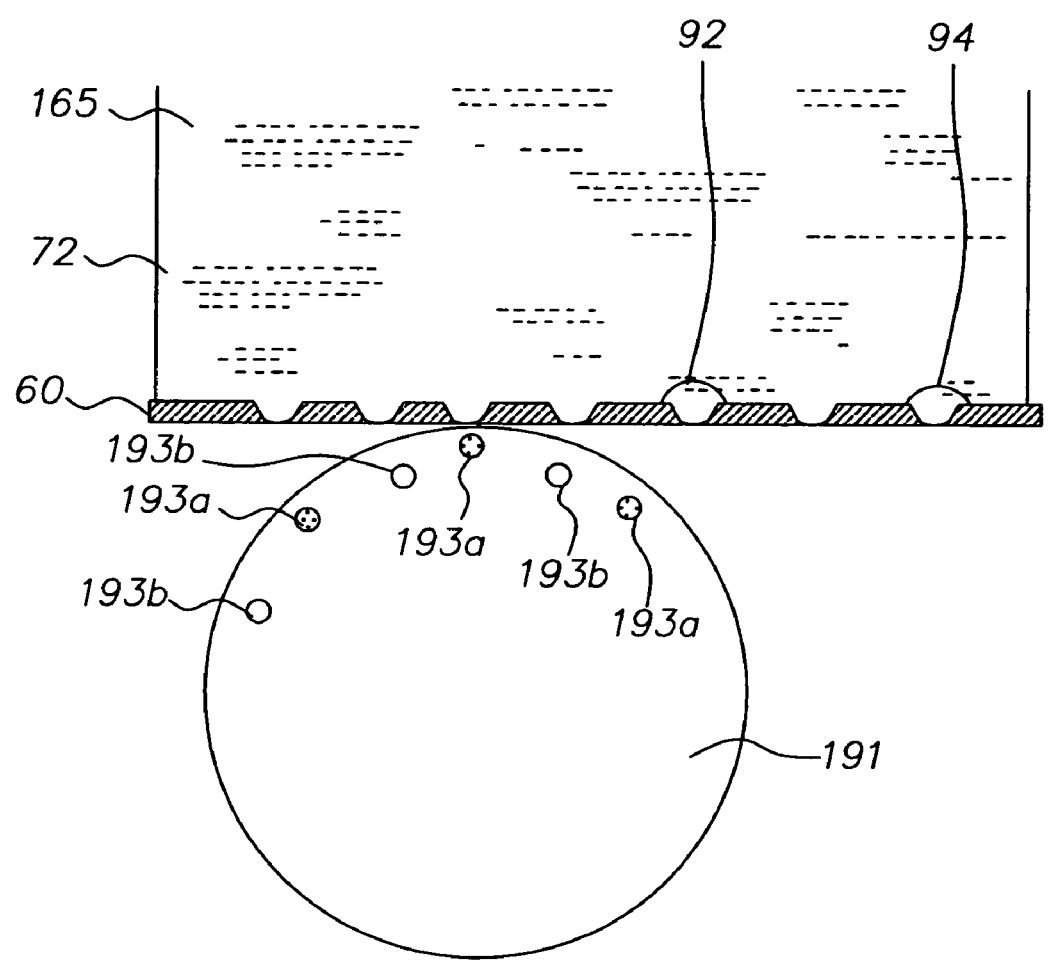
FIG. 8b shows an embodiment of a pattern energizer adapted to supply energy selectively to a support.

FIG. 8b shows one embodiment of pattern energizer such as first pattern energizer 164 comprising a roller 191 that is adapted to provide a pattern of energy directly to support 60. As is shown in FIG. 8b, in this embodiment, roller 191 is adapted with a pattern of selectively addressable heaters 193a and 193b such as microscopic heater-resistor elements positioned near a surface 195 of roller 191. Surface 155 of roller 191 contacts support 60 before or as support 60 passes through first fluid bath 165. In the embodiment shown, heaters 193a are active and produce energy to heat support 60 while heaters 193b are interactive and do not radiate heat. Accordingly, as support 60 is passed into first fluid bath 165, thermally responsive fluid 72 in first fluid bath 165 areas of support 60 that were heated by heaters 193a are heated to form barrier zones as described above, while in other areas, no barrier zones are formed.

Any of the pattern energizers 164, 172, and 182 can comprise, for example, a laser. Typical lasers which may be used include but are not limited to a near infra red laser such as GaAs semi-conductor laser diodes Nd:Yag, and/or Nd:YLF lasers. Alternatively, He/Ne or Ar lasers can also be used. Typically, this is done where support 60 has energy absorbing heat producers positioned to receive the energy from such lasers. In one embodiment, such lasers can be selectively scanned across support 60 to selectively apply energy to support 60 so that barrier zones can be created. For example, a laser such as an infra-red laser can be scanned across support 60 and energy required to produce the desired heating can be selectively applied thereby. In one embodiment, a scanning mirror such as is described in U.S. Pat. No. 6,069,680, filed May 30, 2000 in the names of Kessler et al., entitled "Flying Spot Laser Printer Apparatus and a Method of Printing Suitable for Printing Lenticular Images", can be used to scan a laser.

In another embodiment of this type, laser thermal print heads developed for the graphics arts field such as GaAlAs lasers, can be used or modified to heat the localized regions of support 60. U.S. Pat. No. 4,911,526 filed Mar. 27, 1990 in the names of Hsu et al.; U.S. Pat. No. 4,900,130 filed Feb. 13, 1990 in the name of Haas; U.S. Pat. No. 6,169,565 filed Jan. 2, 2001 in the names of Ramanujan et al.; and WO 01/56788 A2 filed Feb. 1, 2001 in the name of Moulin describe laser thermal print heads 189 that can be used for such purposes. Light from channels of such laser printheads can be individually switched on and off to selectively expose localized regions of support. Hence the printhead prints the pattern of heat where barrier zones are to be established.

In still another embodiment of the invention, energy can be selectively applied by the use of a sound transducer adapted to emit sonic waves that generate heat in the fluid or in the support. An acoustic transducer embodiment of a pattern energizer can comprise for example a piezoelectric transducer or an array of piezoelectric transducers can be used for this purpose.

Figure 8C:
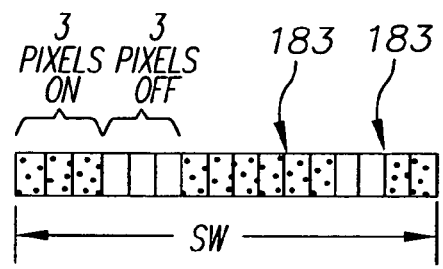
FIGS. 8c and 8d illustrate a thermal printhead embodiment of a pattern energizer.
Figure 8D:
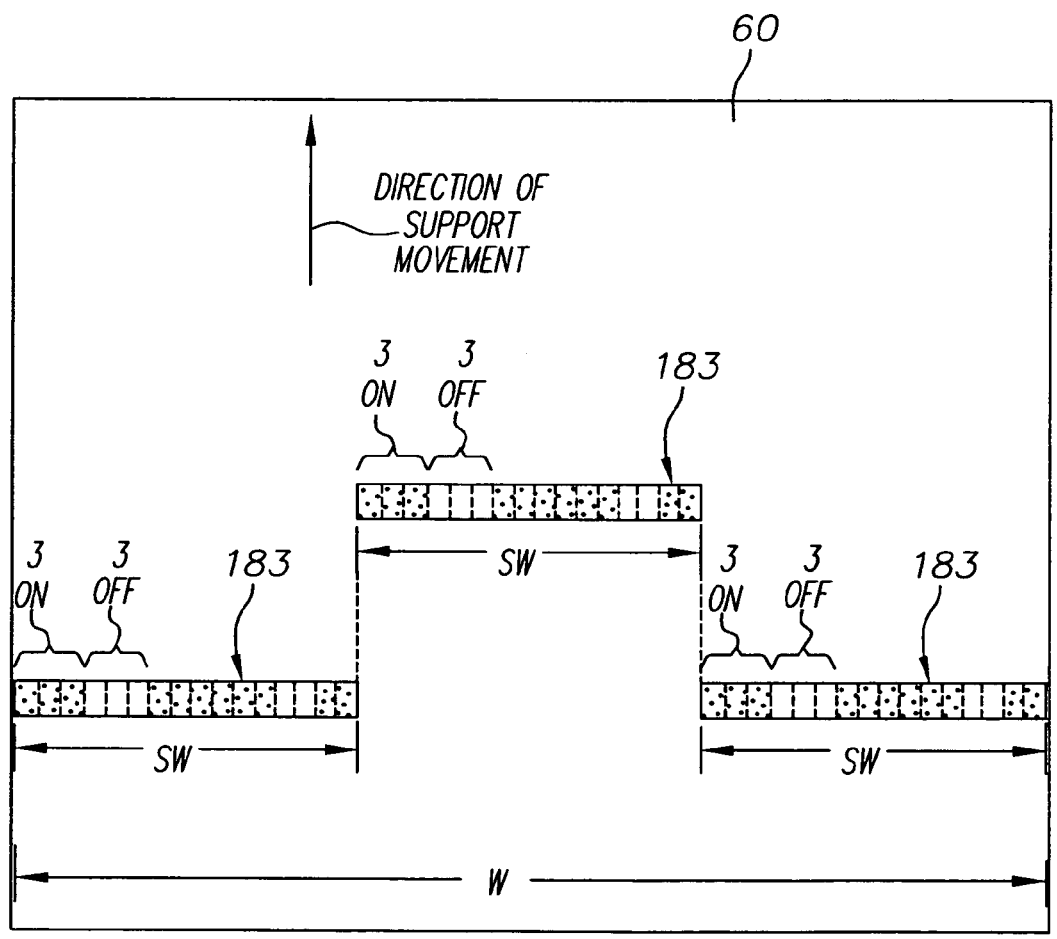

FIG. 8c shows an illustration of a section of a linear laser light beam 183 from a linear laser thermal printhead that can be used for this purpose. In this illustration, linear laser light beam 183 is segmented into a plurality of channels 185. Each channel 185 provides focused light to support 60 to heat support 60. Examples of such multi-channel print heads are provided in U.S. Pat. Nos. 6,582,875, 6,169,565 and WO 0156788. In the embodiment of FIG. 8c, printhead provides channels 185 with a 20 um width W, and has a swath width SW of 5.12 mm. For coverage of the full width of support 60, printhead can be raster scanned back and forth across the support 60 by a conventional translation mechanism such as any known linear translation mechanism. Alternatively, as is shown in FIG. 8d, several laser printheads (not shown) and their linear laser light beams 183a, 183b, and 183c can be staggered and stitched across the width W of support 60. The heated regions of support 60 are heated in a manner that is intended to cause these regions to emit heat as support 60 is exposed to create barrier zones, would need to sustain, and not dissipate until past the rinsing bath. If required, a second raster scanned print head could pass across the support a short tine later, and refresh the heated regions, or a second group of stitched printheads (not shown) could be used.

To improve the absorption of light supplied by a laser, or any optically based pattern heater that uses energy in the form of a beam of light, or an energy absorbing heat producer, such as a compound or other material which is capable of efficiently converting light into heat can be added to a binding site, to the support itself, or to a liquid that can be applied to the support. It will be appreciated that the embodiments of FIG. 5a-5n and FIGS. 6a-6d can be used in combination, e.g. energy absorbing heat producer 132 as described above can be used for this purpose. Such compounds can be applied as shown above or, can be applied in uniform layers on the support. Such compounds include, for example, organic dyes, carbon black, graphite, metal carbides, brides, nitrides, carbonitrides, or oxides. Alternatively, a support 60 can be adapted to absorb the incident light, e.g., when exposing plastic support such as poly (ethylene terephthalate) to an excimer laser.

In still other embodiments, any of pattern energizers 164, 172, and 182 can comprise a linear array heater disposed across a pathway used by support 60 such as an array of laser diodes, or another array of energy absorbing heat producers including but not limited to microwave sources. In yet another embodiment, a pattern of energy is applied using a source of broadcast energy to transmit the energy toward the support and a filter to absorb portions of the broadcast energy so that non-absorbed portions of the broadcast energy strike the support proximate to selected binding sites, causing heat to be transferred by the support proximate to the binding sites. In an alternative embodiment of this type, the pattern of energy formed in this manner is applied to the fluid. In one example of this, a photolithography type process can be used to image a pattern of light onto support 60 or into the thermally responsive fluid in order to create barrier zones as described above 28.

Figure 8E:
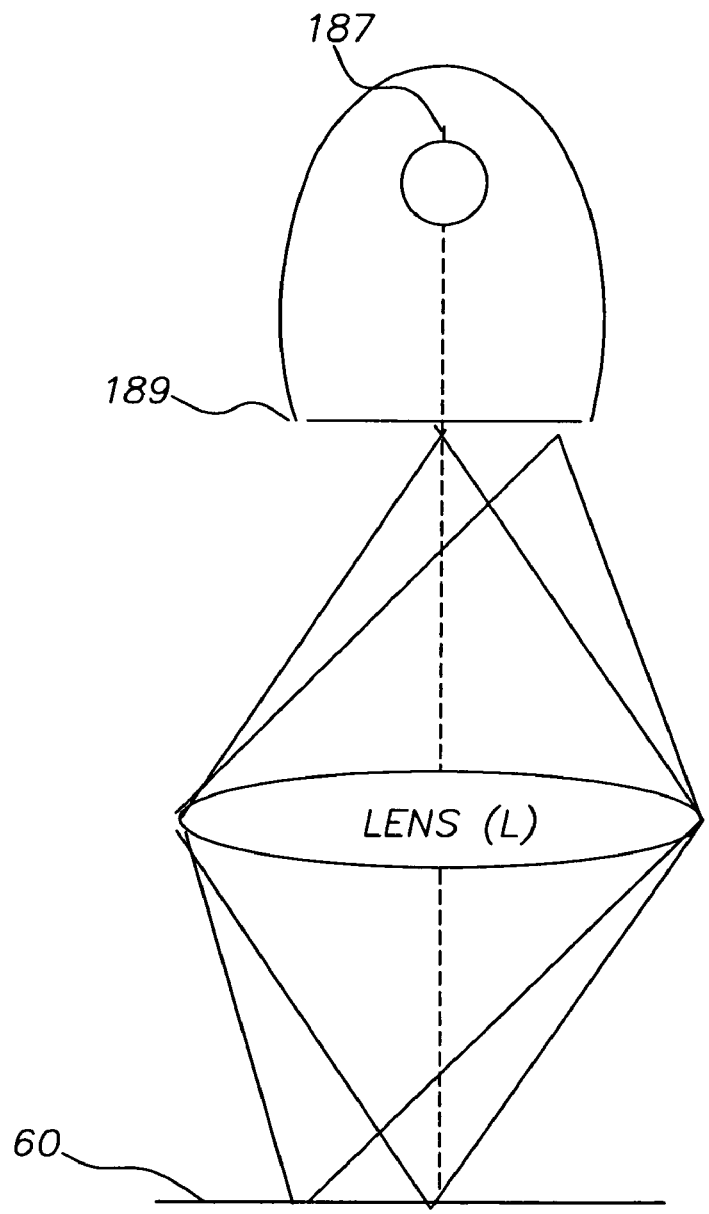
FIG. 8e shows a pattern energizer having a source of broadest energy and a filter.

FIG. 8e shows one embodiment of such an arrangement. As shown in FIG. 8e, flash lamp 187, that preferably emits a good deal of infrared radiation, can be used to provide a pattern of heat for creating barrier zones in particular locations. A mask 189, with openings associated with the barrier zones, is illuminated by flash lamp 187. A lens L images the light emerging from the mask 189 to the absorber on the support 60. Where the light falls on support 60 and absorber, heat is produced creating the condition for forming barrier zones.

Figure 9:
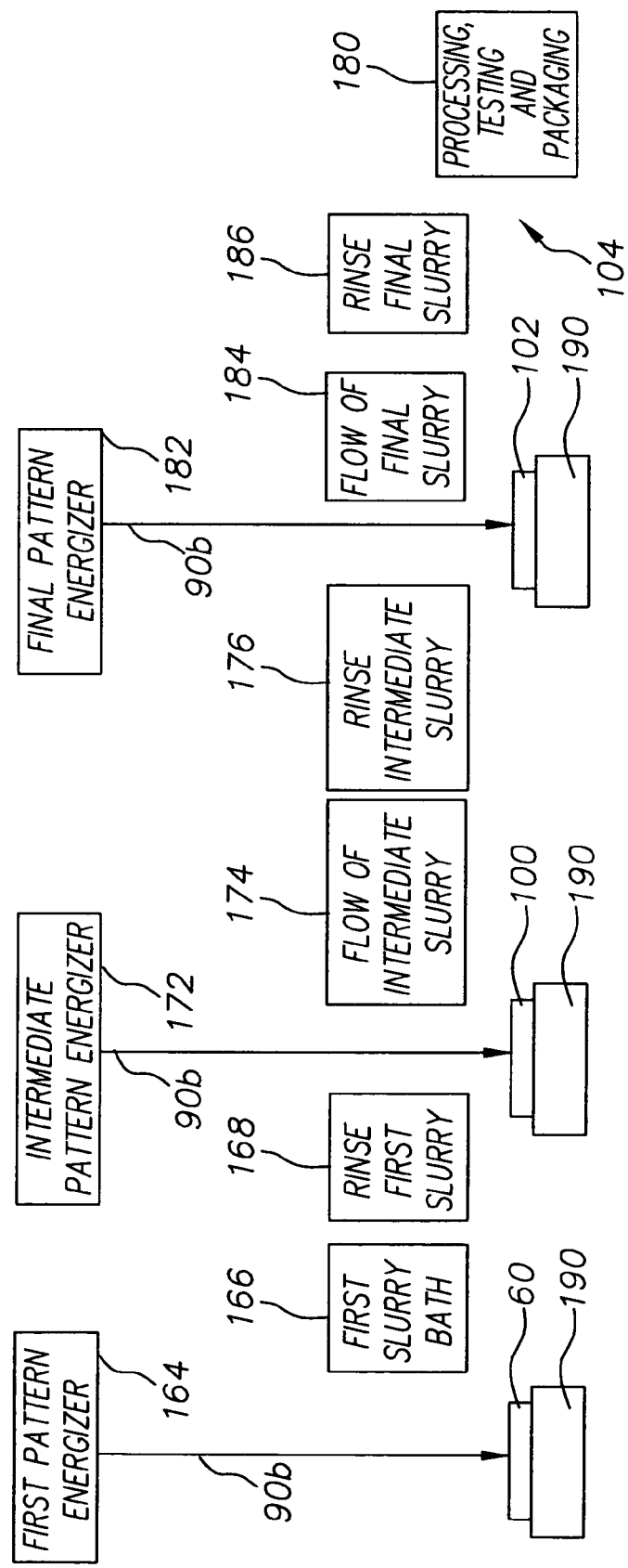
FIG. 9 shows an embodiment of an apparatus for assembling a micro-assembled structure in which energy can be applied selectively to support and thereby to a thermally responsive fluid having micro-components therein in order to permit selective assembly.

It will be appreciated that the methods described with respect FIGS. 7 and 8a-8f can also be performed in a non-continuous process. For example, as is shown in FIG. 9, individual sheets of sections of support 60 can be provided on platen 190 that are passed through system 158 in a sequential or non-sequential process. Platens 190 can comprise any rigid or flexible structure that can hold and position a support 60 during micro-assembly. Platens 190 can be moved by a conveyor system or can be self-propelled and/or self-guiding. In the embodiment shown, energy is applied to support 60, micro-assembled structure 100, and at least one intermediate micro-assembled structure 102, by way of a pattern heater that directly heats the top surface 192, 194 and 196 respectively.

Figure 10:
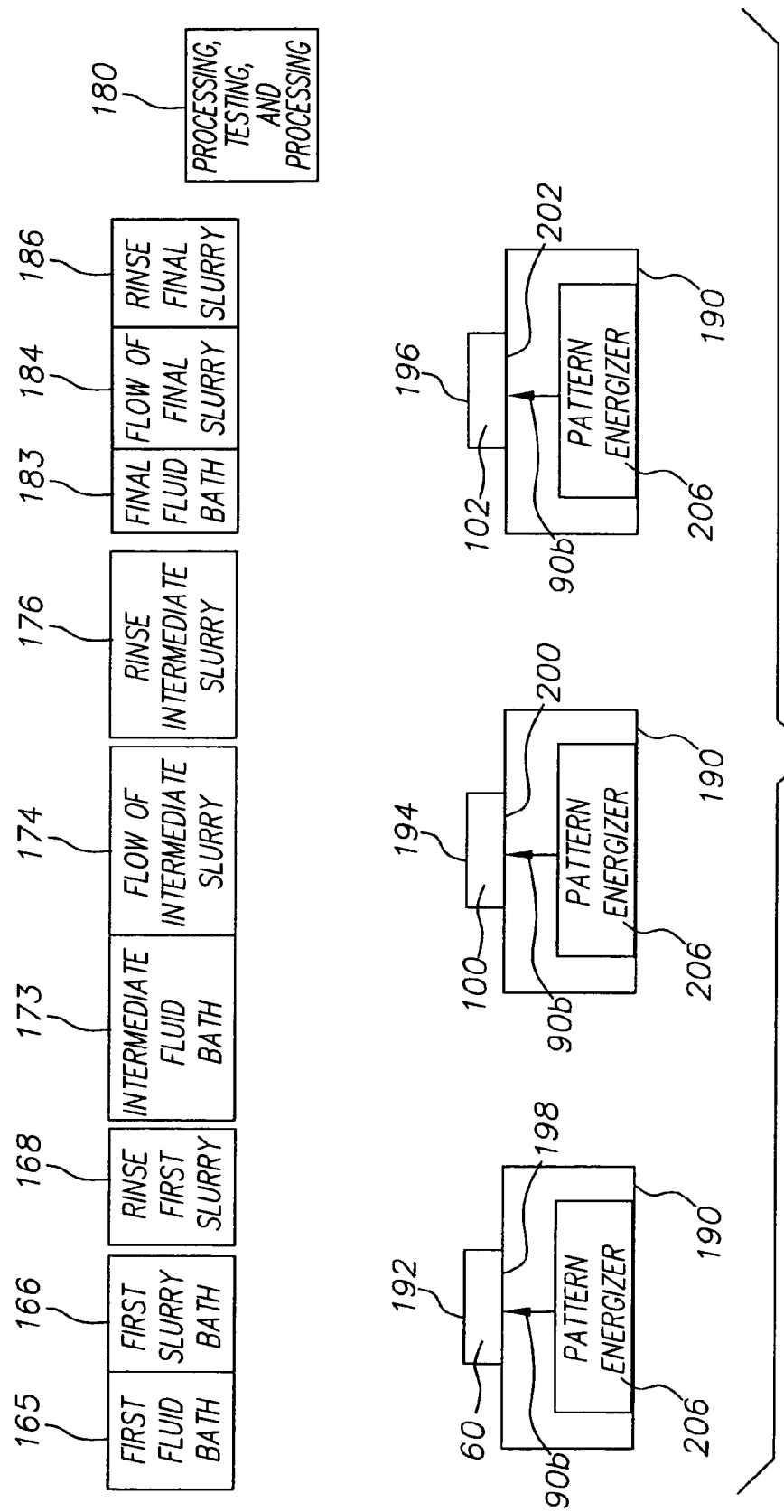
FIG. 10 shows an embodiment of an apparatus for assembling a micro-assembled structure in which energy can be applied selectively to support and thereby to a thermally responsive fluid having micro-components therein in order to permit selective assembly.

However, in another embodiment shown in FIG. 10, platens 190 can be adapted with a patterned contact heater 206 that applies different patterns of energy to support 60, micro-assembled structure 100, and at least one intermediate micro-assembled structure 102, to heat a back surface 198, 200 or 202 respectively which then heats thermally responsive fluid to form barrier zones as described above when exposed to a thermally responsive fluid to allow the formation of selected arrangements of barrier zones.

In another embodiment, individual sheets of support 60 can be passed through any of the above-described embodiments of an apparatus 158 for forming a micro-assembled structure without platens 190. For example, the individual sheets can be passed through apparatus 158 using any known conveyor system including but not limited to a belt drum or other conveying system.

In any of the embodiments shown in FIGS. 6-10, areas of heat radiation can be produced on a support of uniform absorptivity by patterning a source of energy such as a light, with a mask or projection optics, in areas of the same lateral extent as the energy-absorbing heat producers 132, 134 and 136 described with reference to FIGS. 5k-5m above. Where this is done the exposure level of the patterned energy applied between introductions of slurries enables discrimination among binding sites associated with the patches of different lateral extent. It will be appreciated that the embodiments of FIG. 5a-5n and FIGS. 6a-6d, 7, 8a-8e, 9, and 10 can be used in combination to selectively apply energy to binding sites with energy absorbing heat producers that have different energy absorptivities to achieve the formation of barrier zones.

Figure 11A:
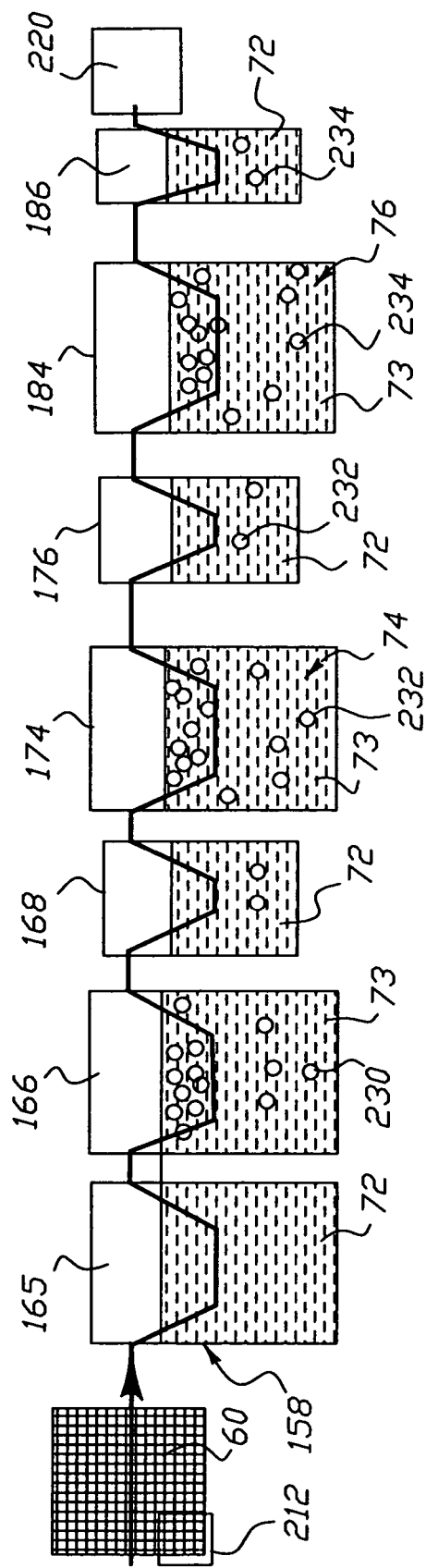

FIGS. 11a-11d illustrate the application of one embodiment of an apparatus 158 for forming a color display having color display elements comprising, in this embodiment, a combination of red, green, and blue colored electrophoretic beads or bichromic beads. FIG. 11a illustrates the movement of a support 60 through micro assembly process while FIG. 11b illustrates a top down view of a section 212 of support 60 before the assembly of the support 60 and micro-components 80-84. FIG. 11c illustrates a top down view of a section 212 of support 60 after a first processing step.

Referring to FIG. 11a, in a first step of the assembly process, support 60 is passed through a first fluid bath 165 containing a thermally responsive fluid. A pattern energizer (not shown) applies a pattern of energy proximate to each of the green micro-cup sites 216, and blue micro-cup sites 218. This causes the formation of a pattern of barrier zones 92 and 94 proximate to the green micro-cup sites 216 and blue micro cup sites 218 as seen on FIG. 11c.

A first slurry bath 166 applies a first slurry 70 of carrier fluid 73 having red micro-beads 230 to support 60. When the first slurry 166 is applied, red micro-beads 230 bind to red micro-cup sites 214. FIG. 11d shows a top view of a completed first micro-assembled structure 100 having an array of red micro-beads filling each of micro-cup sites 214.

In this way a first micro-assembled structure 100 is formed. Micro-assembled structure 100 is then rinsed in rinse 168 to remove any residual unbound red micro-beads 230. The energy that allowed the formation of barrier zones 92 and 94 is then removed or allowed to dissipate so that other barrier zones can be subsequently applied to first micro-assembled structure 100.

In the embodiment shown, after red micro-beads 230 are removed from first micro-assembled structure 100, a new pattern of energy is applied to first micro-assembled structure 100 and first micro-assembled structure 100 is exposed in an intermediate slurry bath 174 having, in this embodiment, intermediate micro-components comprising green micro-beads 232 in a thermally responsive fluid 72 causing the formation of intermediate barrier zones 96 proximate to blue micro-cup sites 218 as is shown on FIG. 11e.

Green micro-beads 232 are barred from engaging red micro-cup sites 214 because red micro-cup sites 214 are occupied by red micro-beads 230 and are also barred from engaging blue micro cups 218 because blue micro-cup sites 218 are shielded by barrier zones 96. Accordingly, as is shown in FIGS. 11e, 11f and 11g, while intermediate slurry 74 is applied to first micro-assembled structure 100 and barrier zones 96, green micro-beads 232 engage green micro-bead cup sites 216 to form a pattern of green micro-beads on support 60 yield an intermediate micro-assembled structure.

As is also shown in FIG. 11g, after assembly intermediate micro-assembled structure 102 is then rinsed by intermediate rinser 176 to remove any unbound green micro-beads 232. During the rinse the intermediate barrier zones 96 are preserved so that unbound green microbeads 232 do not engage blue micro-cup sites 218 during the rinse. The pattern of energy applied to support 60 is removed or allowed to dissipate so that barrier zones 96 can to dissipate enabling blue micro-cup sites 218 to receive blue micro-beads 234.

A final slurry bath 184 applies a final slurry 76 having blue micro-beads 234 and a carrier fluid 73 to intermediate micro-assembled structure 102. Blue micro-beads 234 are blocked from engaging red micro-cup sites 212, and green micro cup sites 214 as they are occupied by, respectively, red micro-beads 230 and green micro-beads 232. Accordingly, as is shown in FIG. 11h, pattern of blue micro-beads 234 engage remaining unoccupied micro-cup sites, blue micro-cup sites 218 to form a pattern of blue micro-beads 234 on support 60 thus, a final micro-assembled structure 104 is formed. Final micro-assembled structure 104 is then rinsed to remove any residual unbound blue micro-beads 234 and then submitted for post-processing 220 which can includes step such as drying, binding, laminating, or assembling final micro-assembled structure well for use as an integrated display component.

FIGS. 12, 13, 14 and 15 illustrate embodiments of the invention wherein a support 60 is provided having electrical conductors 242, 244, 246 and 248 forming a conductive path between binding sites associated therewith. When an electrical signal is applied to electrical conductors 242, 244, 246, and 248 these conductors generate heat. In these embodiments this heat is used to cause barrier zones to form in a thermally responsive fluid for example thermally responsive fluid 72.

Figure 12:
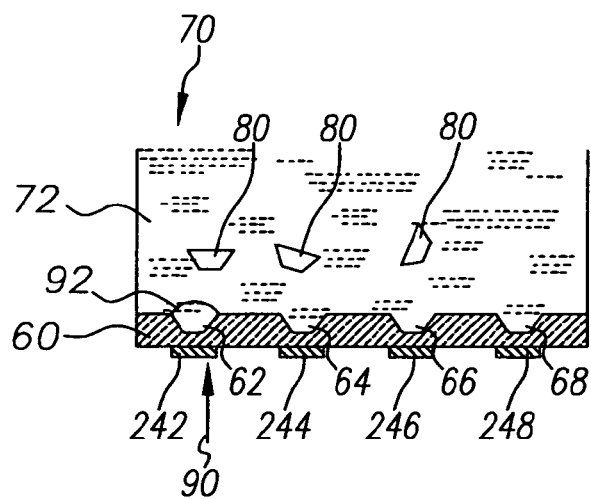
FIGS. 12-15 illustrate embodiments of the invention wherein supports are provided having electrical conductors associated therewith.
Figure 13:
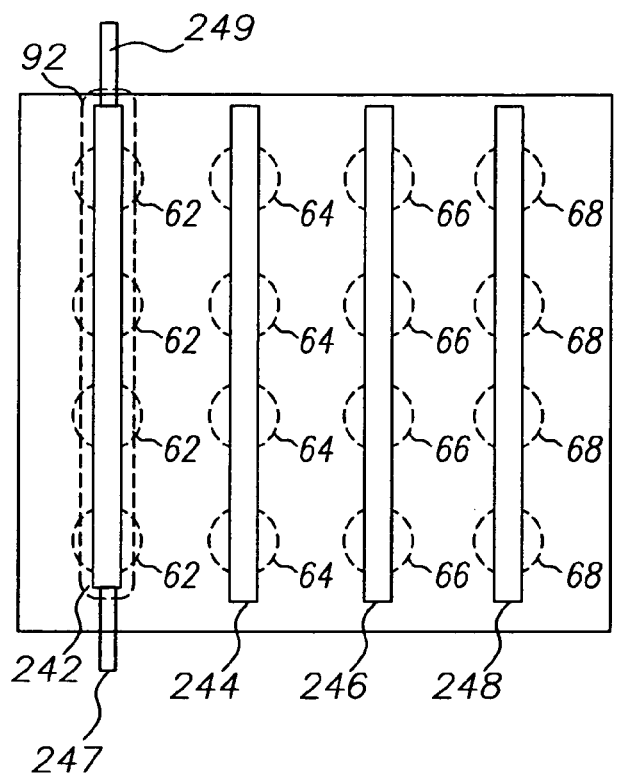

The first embodiment of this type shown in FIGS. 12 and 13, electrical conductors 242, 244, 246 and 248 are located on a conductor side 238 of a support 60 with binding sites 62, 64, 66 and 68 positioned on a binding side 240 of support 60. In this embodiment, each of conductors 242, 244, 226 and 248 is adapted to produce heat when electrical energy in the form of an electrical signal is passed therethrough. Such an electrical signal can comprise a direct current signal or an alternating electrical current or combinations of the same. The electrical signal can be applied by contacting a first end of a conductor with a first electrode 247 and a second end of the conductor with a second electrode 249 and applying the signal between the electrodes. Typically, the amount of heat that is generated by such a conductor is determined as a function of the square of the amount of current introduced into the conductor and the resistance of the conductor.

Electrical conductors 242, 244, 226 and 248 can be formed from any material that is known to produce heat when electrical energy is passed therethrough. Examples of materials that can be used to form electrical conductors such as conductors 242, 244, 246 and 248 include but are not limited to compositions having metals such as copper, aluminum, or steel therein, carbon, graphite, and compositions of Indium Tin Oxide. Electrical conductors 242, 244, 226 and 248 can be formed during fabrication of the support 60 or can be later applied thereto using for example conventional ink jet, continuous ink jet, thermal, vacuum deposition or contact printing techniques known in the art. Electrical conductors 242, 244, 226 and 248 can be positioned on a surface of support 60 or within support 60.

As is shown in FIG. 12 and 13, conductors 242, 244, 246 and 248 are arranged in a linear pattern. When energy is supplied to a conductor such as conductor 242, and support 60 is exposed to a thermally responsive fluid 72, a linear barrier zone 92 can be formed on the binding side 240 of support 60. Such a linear barrier zone 92 can be used, for example, to allow fluidic arrangement of columns or rows of elements of a particular type such as differently colored light emitting elements. However, in other embodiments, the electrical conductors can be applied in a wide variety of patterns so that intricate arrangements of barrier zones can be created.

Figure 14:
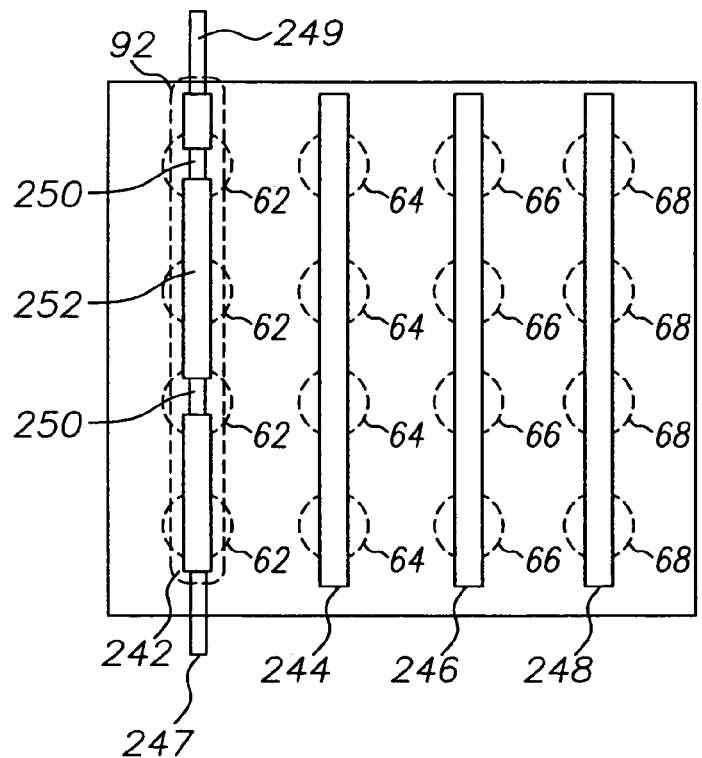

FIG. 14 shows an example embodiment where conductors 242 and 248 are defined in a manner that is intended to cause variable levels of heat emission along the conductors. For example, the resistance of conductor 242 can be defined so that each conductor has areas that are more resistive 250 and areas that are less resistive 252. The more resistive areas 250 generate more heat than the less resistive areas 252 in response to the same electrical signal. In application, this effect can be used so that barrier zones can be selectively formed on a support 60 proximate to selected ones of binding sites 62. In this regard, conductors such as conductors 250 and 252 can be used in manner similar to the embodiments described above with reference to FIGS. 5a-5g. It will also be appreciated that, each conductor 242, 244, 246, and/or 248, can be provided with portions that have a variety of the levels of efficiency in converting electrical energy or and provided by an electrical signal into heat. Using conductors of this type, a multi-step micro-assembly process can be performed in a manner that permits barrier zones to be formed proximate to selected binding sites when a first, relatively high-level of electrical signal is provided into the conductors and that is further adapted to form only a second set of barrier zones when a second lower level of energy is applied to the binding sites so that the same conductors can be used to form different patterns of barrier zones when different levels of energy are applied thereto. This can be used, for example, to execute the assembly system process described above with respect to FIGS. 5k-5m One way to adjust the resistance of a portion of a conductor is to reduce amount of area through which current must pass when traveling through that portion of the conductor. This has the effect of increasing the resistance of that portion of the conductor and is schematically illustrated in FIG. 14. This, in turn, causes that portion of the conductor to generate more heat. Alternatively, portions of the conductors can be made in a different manner than other portions of the conductors so as to increase the resistance of these portions of the conductors. This latter alternative can be accomplished by interposing a resistive material into conductive materials used to form a conductor or by other known materials.

Figure 15:
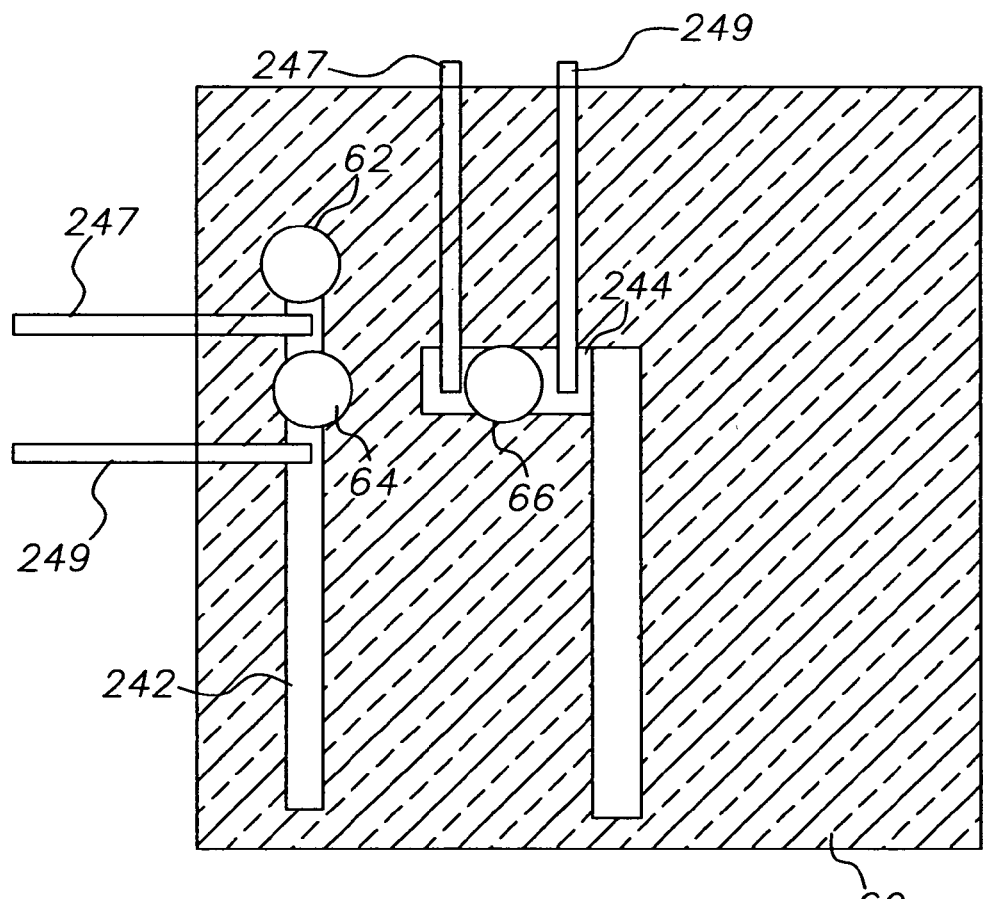

Electrical energy can be applied to the conductors of FIGS. 12 and 13 by directly contacting the conductors 242-248 so that current is passed through the entire length of a conductor such as conductor 242-248 as shown in FIG. 13, or by directly contacting conductors such as conductors 242 to pass current through only a portion of the conductors as is shown in FIG. 15. In this way, during various portions of an assembly process the conductors 242 and 244 can be used to generate heat that is applied to form barrier zones along only a portion of the length of support 60 that corresponds to a portion of the conductors through which an electrical signal is passed. During different stages of manufacture, electrical energy can be passed different portions of the same conductors so that different patterns of binding sites can be formed.

It will be appreciated that in some cases the micro-assembly process described herein can be used to assemble an electrical circuit that incorporates the micro-assembled structures, the support and the conductors in a manner that is similar to a conventional circuit board. In such an embodiment, the conductors therein are primarily shaped and defined for use in carrying electrical or other signals between micro-assembled structures. However, these conductors can also be used to generate heat for forming barrier zones. One way to accomplish this is to simply apply electrical energy to conductors 246 of the circuit in the manner described above. The energy can be applied across the entire length of the conductor or across segments of the conductor as shown above.

Figure 16:
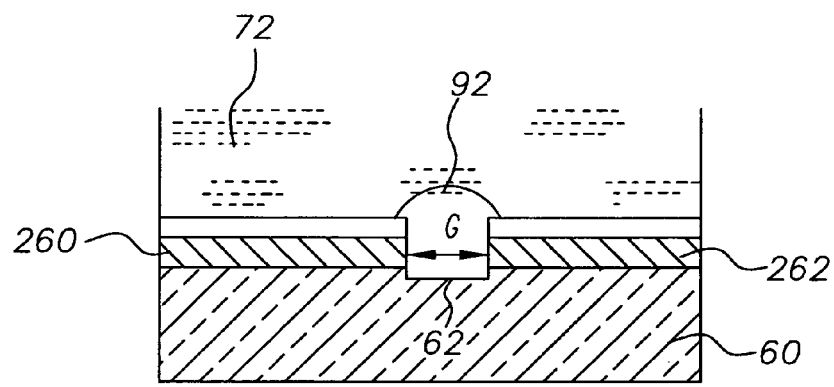
FIG. 16 illustrates an embodiment of the invention wherein the thermally responsive fluid is heated by passing electricity through the thermally responsive fluid within a binding site.

Alternatively, as is shown in FIG. 16, it is often the case that electrical circuits assembled using a support 60 define electrical pathways that pass through micro-components or through structures assembled from a plurality of micro-components. In such cases, an input conductor 260 may lead to a single binding site 62 and an output conductor 262 may lead away from binding site 62. However, there is a gap G between input collector to 260 and output conductor 262. When the gap G is filled with a thermally responsive fluid 72 that is electrically conductive, thermally responsive fluid 72 completes a conductive path is completed across the gap between input conductor 260 and output conductor 262. Electrical energy is then passed from input conductor 260 through thermally responsive fluid 72 to output conductor 262. This electrical energy heats thermally responsive fluid 72 and causes thermally responsive fluid 72 to increase viscosity to form a barrier zone in the gap.

In a subsequent assembly step, electrical energy is not passed between input conductor 260 and output conductor 262 thus, no barrier zone is provided in gap G and micro-components such as intermediate micro-components 84 or final micro-components 86 can enter the gap and can cooperate with input conductor 260 and output conductor 262 to form a micro-assembled circuit.

Figure 17:
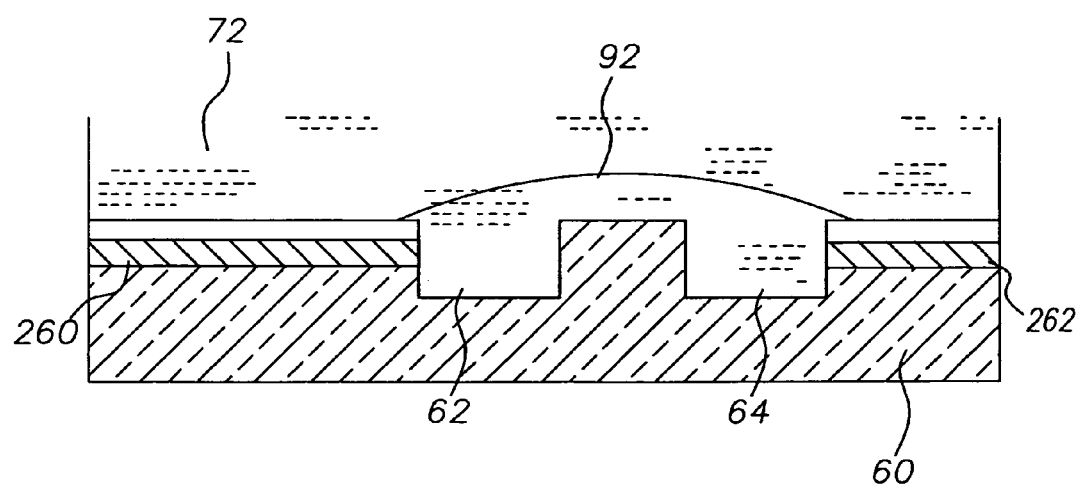
FIG. 17 illustrates an embodiment of the invention wherein the thermally responsive fluid is heated by passing electricity through the thermally responsive fluid between binding sites.

It will be appreciated that are a variety of ways in which electrical energy can be passed through a fluid. For example, in one embodiment shown in FIG. 17 input conductor 260 is connected to a first binding site e.g. binding site 62 and a output electrical conductor 262 is connected to an adjacent binding site 64 so that when an electrical potential is connected across input conductor 260 and output conductor 262, energy can passed between binding sites 62 and 64 to heat a thermally responsive fluid 72 so that a barrier zone 92 can be formed that inhibits micro-components 80 that are in thermally responsive fluid 72 from engaging binding sites 62 and 64.

Although conductors 242-252 and 260 and 262 are shown in FIGS. 12-17 as being positioned on a side of support 60 that is opposite from binding sites 62, 64, 66 and 68 or within support 60, it will be appreciated that this is not limiting and that conductors 242-252 or 260-262 can be positioned in support 60 or on the same side of support 60 that holds binding sites 62, 64, 66 and 68. It will also be appreciated that any of the conductors can be arranged in any shape.

In any embodiment of the invention, the application of energy to heat a thermally responsive fluid can be performed at any time before or during an assembly process and/or before or during rinsing process so long as the energy is applied under circumstances that will allow the formation of barrier zones while there is a meaningful risk that micro-components will be positioned to engage the binding sites. Thus, for example, in the embodiment of FIG. 2, where a first slurry 70 is applied that has a carrier fluid 73 comprising a thermally responsive fluid 72 and first type of micro-components 80, the step of applying a thermally responsive fluid to the support (step 105) can be omitted. This is because, in this embodiment, support 60 is selectively heated (step 107) before first slurry 70 is applied (step 108). This allows barrier zones to form before there is a meaningful risk that first micro-components 80 will bind to the selected binding sites. In this way steps 113 and 118 can also be integrated with steps 115 and 120 respectively, so as to shorten the intermediate assembly and final processes.

In various illustrations shown above, barrier zones 92, 94 and 96 have been shown having shapes defined for illustrative purposes and these shapes are not limiting. It is sufficient that a barrier zone provide only the minimum resistance to the binding of micro-components to a selected binding site to inhibit such binding. For example, in certain embodiments, a partial blockage of a binding site can be sufficient. In another example, where ligands or other biological binding sites are used, it can be sufficient merely to block or mask the receptor sites of the ligand.

Further, in the embodiments illustrated above, barrier zones have been shown as being provided only for open binding sites that do not have micro-components bound thereto. This too is not limiting and the invention can be practiced in a manner that allows the formation of barrier zones proximate to binding sites that are occupied by micro-components.

This can be done, for example, to protect such micro-components from damage during subsequent assembly steps.

The invention has been described in detail with particular reference to certain preferred embodiments thereof, but it will be understood that variations and modifications can be effected within the spirit and scope of the invention.

PARTS LIST 10 substrate
20 binding sites
22 binding site
24 binding site
25 binding site
26 binding site
27 electrodes
28 binding site
29 fluid
32 heat responsive carrier fluid
34 liquid
36 surface
40 first type of micro-components
42 second type of micro-components
47 micro-components
48 hydrophobic surfaces
49 micro-components
51 micro-component
52 micro-component
60 support
62 binding site
64 binding site
66 binding site
68 binding site
70 first slurry
72 thermally responsive fluid
73 carrier fluid
74 intermediate slurry
76 final slurry
80 first type of micro-component
82 intermediate type of micro-component
84 intermediate type of micro-component
86 final type of micro-component
88 liquid engagement surface
90 energy
92 barrier zone
94 barrier zone
96 energy
98 barrier zone
100 micro-assembled structure
102 intermediate assembled structure
104 final micro-assembled structure
105 provide support step
106 provide carrier fluid step
107 apply energy to carrier fluid step
108 apply first slurry step
109 remove first slurry step
110 remove energy step
111 further assembly determining step
112 last assembly determining step
113 apply thermally responsive fluid step
114 provide energy to heat thermally responsive fluid step
115 applied final slurry step
116 remove thermally responsive fluid step
117 remove energy step
118 apply thermally responsive fluid step
119 provide energy step
120 apply intermediate slurry step
121 remove intermediate slurry step
122 remove energy step
132 energy absorbing heat producer
134 energy absorbing heat producer
136 energy absorbing heat producer
138 energy absorbing heat producer
140 liquid absorbing heat producer
142 conductive energy absorbing heat producer
143 inductor
144 capacitor
145 conductive energy absorbing heat producer
146 inductor
147 capacitor
148 contact heater
150 heating block
152 projections
154 selectively addressable actuators
156 selectively actuatable resistive energy absorbing heat producer
158 apparatus for assembling a micro-assembled structure
160 supply
162 first roller
164 first pattern energizer
165 first bath containing thermally responsive carrier liquid
166 first slurry bath
168 rinsing device
170 intermediate roller
172 intermediate pattern energizer
174 intermediate slurry bath
176 intermediate rinsing device
180 final roller
182 final pattern energizer
183a, b, c laser thermal printhead
184 final slurry bath
185a, b, c channels
186 final rinsing device
188 post-assembly processing station
190 platen
191 roller
192 top surface of platen
139a heater
193b heater
194 top surface of platen
196 top surface of platen
198 back surface of platen
200 back surface of platen 202 back surface of platen
206 pattern contact heater
210 micro-cup sites
212a section
214 red micro-cup sites
216 green micro-cup sites
218 blue micro-cup sites
220 postprocessing step
230 red micro-beads
232 green micro-beads
234 blue micro-beads
238 conductor side of support
240 binding side of support
242 conductor
244 conductor
246 conductor
248 conductor
250 more resistive area
252 less resistive area
254
256 inductor
260 input conductor
262 output conductor
L lens
W width
SW swath width

The invention claimed is:

1. A method for assembling micro-components to binding sites on a support having a pattern of electrical conductors adapted to conduct electrical energy between binding sites, the method comprising the steps of:
passing an electrical signal through at least one conductive path including at least one of the conductors so that heat is generated by a portion of each conductive path proximate to the binding sites;
applying, to the support, a first fluid that is adapted to increase in viscosity when heated; and
applying, to the support, a carrier fluid having first micro-components adapted to engage the binding sites,
wherein the heat from the at least one conductive path increases the viscosity of the first fluid in areas proximate to the selected binding sites so as to inhibit first micro-components from engaging the binding sites.

2. The method of claim 1, wherein the at least one conductor generates heat when an electrical signal is passed therethrough.

3. The method of claim 1, wherein the conductive path includes an input conductor, an output conductor and a fluidic path between the input conductor portion and the output conductive portion, wherein the conductive path comprises the first fluid and wherein the electrical signal passing through the first fluid heats the first fluid to increase the viscosity of the first fluid in the binding site.

4. The method of claim 1, wherein the conductive path includes an input conductor leading to a first binding site and also comprises an output conductor leading to a second binding site and wherein the electrical signal is applied after the first fluid is applied to the support so that the electrical signal passes from the input conductor through the first fluid and to the second conductor to increase the viscosity of the first fluid at the first and second binding sites.

5. The method of claim 1, further comprising the step of removing the first fluid and any non-engaged micro-components from the first support, and applying a second fluid having second micro-components therein adapted to engage the support, so that the second micro-components can engage the selected binding sites.

6. The method of claim 5, wherein the second fluid comprises a fluid that increases viscosity in response to heat and further comprising the step of passing an electrical current through less than all of the conductive paths associated with the selected binding sites so that the viscosity increases to inhibit micro-components from engaging selected ones of the binding sites.

7. The method of claim 1, wherein an electrical current is passed through a portion of a conductor.

8. A method for assembling micro-components to binding sites on a support having a pattern of electrical conductors adapted to conduct electrical energy between binding sites; the method comprising the steps of:
passing an electrical signal through a first pattern of conductive pathways including at least one of the conductors so that a first pattern of heat is generated by the conductive pathways proximate to a first pattern of selected binding sites;
applying, to the support, a first fluid that is adapted to increase in viscosity when heated;
applying, to the support, a carrier fluid having first micro-components adapted to engage the binding sites;
removing, from the support, the carrier fluid, the first fluid and any of the first micro-components not engaged to a binding site;
passing a second electrical signal through a second pattern of conductive pathways that includes at least one of the conductors and that is different from the first pattern so a second pattern of heat is generated by the conductive pathways proximate to and a second pattern of selected binding sites;
applying, to the support, a second fluid that is adapted to increase in viscosity when heated; and
applying, to the support, a second carrier fluid having second micro-components adapted to engage the binding sites;
wherein the first pattern of heat from the conductive pathways increases the viscosity of the first fluid proximate to the first pattern of selected binding sites so as to inhibit first micro-components from engaging the first pattern of selected binding sites; and
wherein the second pattern of heat from the conductive pathways increases the viscosity of the second fluid proximate to the second pattern of selected binding sites so as to inhibit second micro-components from engaging the second pattern of selected binding sites.

9. The method of claim 8, wherein a first set of contacts engages the conductive pathways of the first pattern to pass the first electrical signal to the first pattern of conductors, and wherein a second set of contacts engages the conductive pathways of the second pattern of conductive pathways to pass the second electrical signal to the second pattern of conductors.

* * * * *